(12) United States Patent
Suenaga et al.

(10) Patent No.: US 8,304,966 B2
(45) Date of Patent: Nov. 6, 2012

(54) PIEZOELECTRIC THIN FILM ELEMENT AND MANUFACTURING METHOD OF THE PIEZOELECTRIC THIN FILM ELEMENT, PIEZOELECTRIC THIN FILM DEVICE

(75) Inventors: Kazufumi Suenaga, Tsuchiura (JP); Kenji Shibata, Tsukuba (JP); Hideki Sato, Hamamatsu (JP); Akira Nomoto, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 123 days.

(21) Appl. No.: 12/819,424

(22) Filed: Jun. 21, 2010

(65) Prior Publication Data

US 2010/0320871 A1 Dec. 23, 2010

(30) Foreign Application Priority Data

Jun. 22, 2009 (JP) .................................. 2009-147993
Mar. 5, 2010 (JP) .................................. 2010-048790

(51) Int. Cl.
*H01L 41/187* (2006.01)
(52) U.S. Cl. ....................................................... 310/358
(58) Field of Classification Search .................... 310/358
See application file for complete search history.

(56) References Cited

U.S. PATENT DOCUMENTS

| 6,347,862 | B1 | 2/2002 | Kanno et al. | |
|---|---|---|---|---|
| 7,482,736 | B2 | 1/2009 | Ueno et al. | |
| 7,589,450 | B2 * | 9/2009 | Takabe et al. | 310/311 |
| 7,759,846 | B2 * | 7/2010 | Sakashita et al. | 310/358 |
| 2005/0099094 | A1* | 5/2005 | Nishihara et al. | 310/324 |
| 2006/0214539 | A1* | 9/2006 | Sato | 310/320 |
| 2007/0024162 | A1* | 2/2007 | Shibata et al. | 310/358 |
| 2007/0126313 | A1 | 6/2007 | Ueno et al. | |
| 2008/0308762 | A1 | 12/2008 | Ueno et al. | |
| 2009/0096328 | A1* | 4/2009 | Shibata et al. | 310/346 |
| 2010/0013894 | A1 | 1/2010 | Ueno et al. | |

FOREIGN PATENT DOCUMENTS

| JP | 10286953 A | 10/1998 |
|---|---|---|
| JP | 2007019302 A | 1/2007 |
| JP | 2007184513 A | 7/2007 |

\* cited by examiner

*Primary Examiner* — Derek Rosenau
(74) *Attorney, Agent, or Firm* — Martin Fleit; Paul D. Bianco; Fleit Gibbons Gutman Bongini & Bianco PL

(57) ABSTRACT

To provide a piezoelectric thin film element capable of improving piezoelectric characteristics and realize a piezoelectric thin film device with high performance and high reliability, comprising: a substrate; and a piezoelectric thin film formed on the substrate by a sputtering method, with perovskite oxide expressed by $(Na_xK_yLi_z)NbO_3$ ($0 \leq x \leq 1$, $0 \leq y \leq 1$, $0 \leq z \leq 0,2$, $x+y+z=1$) as a main phase, wherein an absolute value of an internal stress of the piezoelectric thin film is 1.6 GPa or less.

23 Claims, 14 Drawing Sheets

(a)

(b)

(a)

(b)

(a)

(b)

(a)

(b)

PIEZOELECTRIC THIN FILM ELEMENT AND MANUFACTURING METHOD OF THE PIEZOELECTRIC THIN FILM ELEMENT, PIEZOELECTRIC THIN FILM DEVICE

BACKGROUND OF THE INVENTION

1. Field of the Invention

The present application is based on Japanese Patent Applications No. 2009-147993 and 2010-048790, filed on Jun. 22, 2009 and Mar. 5, 2010, the entire contents of which are hereby incorporated by reference.

The present invention relates to a piezoelectric thin film element using lithium potassium sodium niobate and a manufacturing method of the same, and a piezoelectric thin film device.

2. Description of the Related Art

A piezoelectric body is processed into various piezoelectric elements according to various purposes, and is widely used as an actuator for generating deformation by applied voltage, and a functional electronic component such as a sensor for generating the voltage from the deformation of the piezoelectric element. A lead-based dielectric material having large piezoelectric characteristics is generally known as the piezoelectric body utilized for the purpose of usage in the actuator and the sensor. Particularly, $Pb(Zr_{1-x}Ti_x)O_3$-based perovskite ferroelectric material called PZT has been generally known heretofore. Ordinarily, these piezoelectric materials are formed by sintering an oxide made of a piezoelectric material.

Meanwhile, in recent years, development of the piezoelectric substance not containing lead is desired from the consideration of an environment, and development of sodium potassium lithium niobate (general formula: $(Na_xK_yLi_z)NbO_3$ ($0<x<1$, $0<y<1$, $0<z<1$, $x+y+z=1$), etc, has been progressed. The sodium potassium lithium niobate has the piezoelectric characteristics comparable to PZT, and therefore is expected as a dominant candidate of the non-lead piezoelectric material.

At present, as downsizing and higher performance of each kind of electronic component is progressed, the downsizing and higher performance are also required in the piezoelectric element. However, in a piezoelectric material manufactured by a manufacturing method typified by a sintering method, being a method performed conventionally, as its thickness becomes thinner, particularly as the thickness becomes closer to the thickness of about 10 μm, this thickness becomes closer to the size of a crystal grain constituting the material, and its influence can not be ignored. This involves a problem that variation and deterioration of the characteristics is remarkable, and in order to avoid this problem, a forming method of the piezoelectric substance applying a thin film technique in place of the sintering method has been studied in recent years.

In recent years, a PZT piezoelectric thin film formed by RF sputtering method is put to practical use as an actuator for a head of highly precise high speed ink jet printer or a small-sized and inexpensive gyro sensor (for example, see patent document 1 and non-patent document 1). Further, the piezoelectric thin film element using a piezoelectric thin film made of lithium potassium sodium niobate not using lead is also proposed (for example, see patent document 3).

(Patent Documents)
(Patent document 1) Japanese Patent Laid Open Publication No. 10-286953
(Patent document 2) Japanese Patent Laid Open Publication No. 2007-19302
(Patent document 3) Japanese Patent Laid Open Publication No. 2007-184513
(Non-Patent Document)
(Non-patent document 1) High performance and advanced application technology of piezoelectric material (published by science & technology in 2007) supervised by Kiyoshi Nakamura The head for highly precise high speed ink jet printer or the small-sized and inexpensive gyro sensor with low environmental load can be fabricated, by forming a non-lead piezoelectric thin film as the piezoelectric thin film. As a specific candidate thereof, basic study on a thinner film of the lithium potassium sodium niobate has been progressed. However, in a conventional art, the non-lead piezoelectric thin film element and piezoelectric thin film device satisfying a requested performance can not be stably provided.

SUMMARY OF THE INVENTION

In order to solve the above-described problem, an object of the present invention is to provide a non-lead piezoelectric thin film element satisfying a requested performance and a manufacturing method of the same, and a piezoelectric thin film device.

According to an aspect of the present invention, a piezoelectric thin film element is provided, including:

a substrate; and a piezoelectric thin film formed on the substrate by a sputtering method, with perovskite oxide expressed by $(Na_xK_yLi_z)NbO_3$ ($0 \leq x \leq 1$, $0 \leq y \leq 1$, $0 \leq z \leq 0, 2$, $x+y+z=1$) as a main phase, wherein an absolute value of an internal stress of the piezoelectric thin film is 1.6 GPa or less.

Further, preferably a variation rate of a curvature radius of a warpage shape of the substrate that increases/decreases according to a variation rate of a thickness of the substrate, is twice or more of the variation rate of the thickness of the substrate.

Further, a base layer for controlling an orientation of the piezoelectric thin film, is formed between the substrate and the piezoelectric thin film.

Further, preferably the base layer is a Pt thin film formed in orientation to (111) plane.

Further, preferably a lower electrode layer is formed between the substrate and the base layer, and an adhesive layer is formed between the lower electrode layer and the substrate, and an absolute value of an internal stress of the adhesive layer or the base layer or both layers is 1.6 GPa or less.

Further, the curvature radius of the piezoelectric thin film is 0.8 m or more.

Further, preferably an upper electrode is formed on the piezoelectric thin film, and a lower electrode is formed between the substrate and the piezoelectric thin film, and a curvature radius of the lower electrode layer or the upper electrode layer or both electrode layers is 0.8 m or more.

Further, the piezoelectric thin film is formed in an atmosphere of Ar gas or a mixed gas in which oxygen is mixed into the Ar gas by a sputtering method, and Ar is contained in the piezoelectric thin film.

Further, the substrate is a Si substrate with an oxide film.

Further, in a method of manufacturing the piezoelectric thin film element, an absolute value of a curvature of the piezoelectric thin film is controlled in a range of 0.15 $m^{-1}$ or less, and preferably 0.07 $m^{-1}$ or less.

Further, in the method of manufacturing the piezoelectric thin film element, an absolute value of an internal stress of the piezoelectric thin film is controlled in a range of 0.9 GPa or less and preferably 0.45 GPa or less.

According to other embodiment of the present invention, a piezoelectric thin film device is provided, including the piezoelectric thin film element and a voltage application part or a voltage detection part.

Preferably, an internal stress of the piezoelectric thin film is controlled by a sputtering input electric power during film formation. Further, the internal stress of the piezoelectric thin film may be controlled by selection of the substrate, or may be controlled by a heat treatment temperature of heat treatment executed after film formation of the piezoelectric thin film.

In the piezoelectric thin film element, preferably when the thickness of the substrate is set to 0.3 mm, a curvature radius of the substrate is 0.8 m or more.

Further, a part of the piezoelectric thin film may includes any one of a crystal layer of $ABO_3$ having a perovskite structure, an amorphous layer of $ABO_3$, or a mixed layer in which crystal and amorphousness of $ABO_3$ are mixed. However, A is one kind or more elements selected from Li, Na, K, La, Sr, Nd, Ba, and Bi, and B is one kind or more elements selected from Zr, Ti, Mn, Mg, Nb, Sn, Sb, Ta, and In, and O is oxygen.

According to the present invention, the non-lead based piezoelectric thin film element satisfying the requested performance can be provided.

BRIEF DESCRIPTION OF THE DRAWINGS

FIG. 1 is an explanatory view of a piezoelectric thin film element including a lower electrode layer and a piezoelectric thin film according to an embodiment of the present invention, wherein FIG. 1A is a cross-sectional view showing a compressive stress state and FIG. 1B is a cross-sectional view showing a tensile stress state.

FIG. 3 is a view showing a measurement result of a warpage shape obtained by an optical lever method of a KNN piezoelectric thin film according to an embodiment of the present invention, wherein FIG. 3A shows a case that the warpage shape is a convex and FIG. 3B shows a case that the warpage shape is a concave.

FIG. 5 is a comparison characteristic view of the KNN piezoelectric thin film formed on different substrates of an embodiment of the present invention, wherein FIG. 5A is a comparison view of a curvature radius, and FIG. 5B is a comparison view of an internal stress.

FIG. 8 is an explanatory view of a piezoelectric thin film element including a lower electrode layer, a LNO base layer, a KNN piezoelectric thin film and an upper electrode layer according to an embodiment of the present invention, wherein FIG. 8A is a cross-sectional view showing a compressive stress state and FIG. 8B is a cross-sectional view showing a tensile stress state.

FIG. 9 is an explanatory view of a piezoelectric thin film element including a lower electrode layer, each kind of base layer, a KNN piezoelectric thin film and an upper electrode layer according to an embodiment of the present invention, wherein FIG. 9A is a cross-sectional view showing a compressive stress state and FIG. 9B is a cross-sectional view showing a tensile stress state.

DETAILED DESCRIPTION OF THE INVENTION

Figure 1:
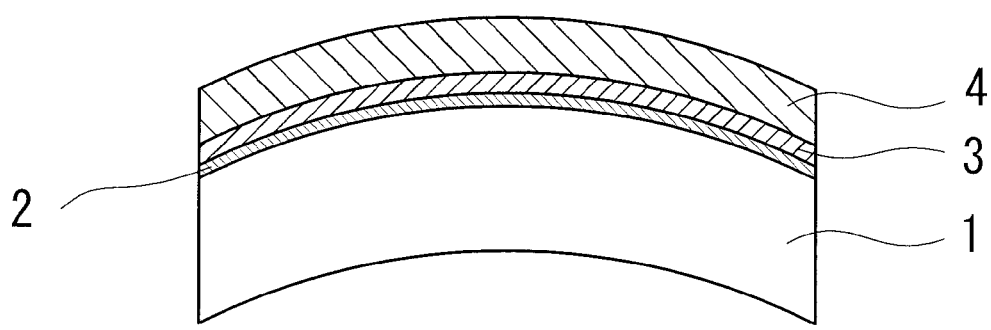
Figure 1:
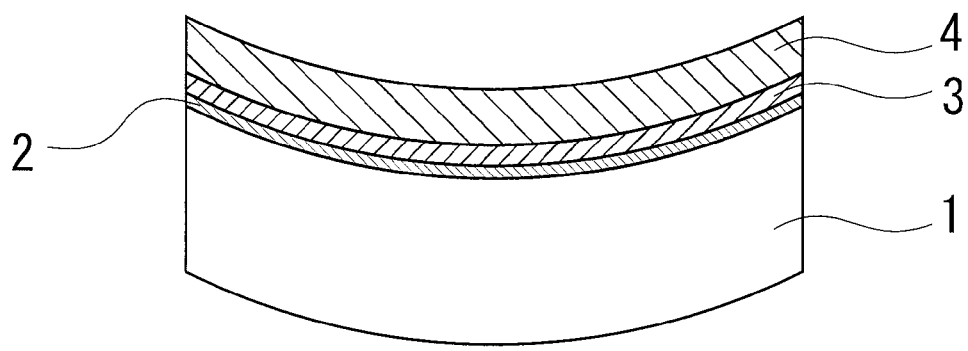

The present invention relates to a KNN ($(K,Na)NbO_3$) piezoelectric thin film. A material having small internal stress has a low dielectric constant, and as a result, a piezoelectric constant is sometimes decreased. Further, there is also a material capable of improving piezoelectric characteristics by increasing the internal stress. Moreover, the KNN piezoelectric thin film is not necessarily behave in the same way as a lead-based piezoelectric material in a relation between the internal stress and the piezoelectric constant, because the KNN piezoelectric thin film has a different composition from that of a conventional lead-based piezoelectric material (such as PZT). It is a well-known matter that a thin film and a bulk material have different physical properties, and a relation between the internal stress and the piezoelectric characteristics of the thin film is not known unless the relation between them is specifically and practically analyzed.

Therefore, an optimization of manufacturing conditions and a stress analysis, etc, of the KNN piezoelectric thin film are performed by inventors of the present invention, to investigate the relation between the internal stress and the piezoelectric constant in the KNN piezoelectric thin film. As a result, in the KNN piezoelectric thin film, it is recognized that the piezoelectric characteristics are greatly influenced by the internal stress. Then, it is also found that internal stress of zero contributes to improvement of the piezoelectric characteristics.

Based on the aforementioned knowledge, the inventors of the present invention complete the present invention.

An embodiment of the piezoelectric thin film element of the present invention will be described hereafter. Manufacturing conditions of the piezoelectric thin film element having an influence on the internal stress of the piezoelectric thin film will be examined first.

Residual stress (internal stress) of the piezoelectric thin film needs to be managed and controlled, to stably produce a non-lead based piezoelectric thin film element while satisfying requested performance for every element.

The reason therefore is as follows. The internal stress given by the piezoelectric thin film includes a tensile stress and a compressive stress. The tensile stress is a stress that works to peel-off a film and the compressive stress works vice versa. This is because when the internal stress is large, film peel-off is caused thereby or breakage of the film is generated, thereby having an adverse influence on an upper electrode layer placed thereon.

[Warpage Shape of the Piezoelectric Thin Film]

When a lower electrode layer is formed on a substrate such as a Si substrate having a thermal expansion coefficient different from that of a lithium potassium sodium niobate film (including a potassium sodium niobate film) and the lithium potassium sodium niobate film is formed thereon without considering the difference in thermal expansion coefficients, the film is formed into a warpage shape. Namely, a substrate with a piezoelectric thin film has an unexpected warpage.

Conventionally, the lithium potassium sodium niobate film is formed without examining the influence of a warpage shape and a magnitude of the internal stress, and therefore the warpage shape of the lithium potassium sodium niobate film is formed in such a manner as being different in many cases every time the element is manufactured. Actually, the warpage shape of the lithium potassium sodium niobate film is formed into various shapes such as a concave shape and a convex shape. The lithium potassium sodium niobate is abbreviated as LKNN and the potassium sodium niotbate is abbreviated as KNN hereafter.

The warpage shape of the LKNN film takes various shapes such as a concave shape and a convex shape. The reason therefore is considered as follows. (1) temperature coefficients of expansion/contraction of the LKNN film, the substrate, and the lower electrode layer are different, and therefore contraction is different between the film and the substrate depending on a difference between a temperature for forming the thin film and a room temperature, or (2) attraction force works between grains by generation of a sudden lattice contraction or expansion accompanied by crystal growth, when the film is formed at not less than a crystallization temperature, and further (3) lots of sputtering particles are injected into a grain boundary by an energy particle impact such as Ar ions (called $Ar^+$ hereafter), by increasing an input electric power during sputtering film formation, and as a result, a dense film is formed and an extending force is generated in a surface, thus forming a convex shape, and the warpage is thereby induced in the LKNN film formed thereon.

[Selection of the Substrate]

Therefore, first, the difference in the thermal expansion coefficients between the LKNN film and the substrate was examined. Then, examination was performed for selecting the substrate with large curvature radius of the piezoelectric thin film (little warpage amount) during film formation.

As a selection method, the substrate having a value close to the thermal expansion coefficient of LKNN of bulk was selected. As a candidate of such substrates, crystal or amorphousness of MgO, Si, Ge, $Al_2O_3$, $SrTiO_3$, quartz or a complex thereof is desirable. Regarding an element with a lower electrode layer formed on such substrates and LKNN film formed thereon, each warpage amount was compared and actually the substrate with small warpage amount was selected.

[Film Forming Conditions]

Further, in order to further ensure the reduction of the internal stress of the LKNN film, in the aforementioned embodiment, manufacturing conditions are found out for decreasing the warpage amount, regarding a film formation temperature, the kind and pressure of sputtering operation gas, degree of vacuum and input electric power. Then, such manufacturing conditions are preferably optimized. By examining various aspects of these conditions, for every apparatus and according to an environment, the LKNN thin film with low internal stress can be formed.

[Surface Flattening of the Lower Electrode Layer]

Next, flattening of a Pt lower electrode layer, being a base, is performed, so as to obtain a uniform internal stress of the LKNN film with low distortion. As a method therefore, film thickness of the Pt lower electrode layer is strictly controlled, to thereby reduce surface irregularities of the Pt lower electrode layer. Further, by controlling and forming a polycrystalline Pt lower electrode layer to obtain uniform size of its crystal grains, a stress added between crystal grains is uniformly dispersed. As a result, when the LKNN film is formed on the lower electrode layer with grain size uniformed, an effect of reducing the internal stress of the piezoelectric thin film by stress relaxation of an interface can be expected.

An embodiment of the piezoelectric thin film element according to the present invention will be described, based on a result of examining the manufacturing conditions of the piezoelectric thin film element having an influence on the internal stress of the piezoelectric thin film as described above.

As a result of strenuous efforts by the inventors of the present invention, it is found that the internal stress of the piezoelectric thin film can be controlled by the manufacturing conditions of the element. Here, as the manufacturing conditions of the element, the sputtering input electric power during film formation and heat treatment temperature after film formation are suitably controlled. Further, the substrate, lower/upper electrodes, an adhesive layer, a base layer, or the piezoelectric thin film, etc, being constituent materials of the piezoelectric thin film element, are suitably selected. The piezoelectric thin film element with the internal stress of the piezoelectric thin film controlled by each manufacturing condition, will be described hereafter.

[Piezoelectric Thin Film Element]

The piezoelectric thin film element of this embodiment has the substrate, the lower electrode layer formed on this substrate, and the piezoelectric thin film formed on the lower electrode layer. The piezoelectric thin film is a film with a perovskite oxide as a main phase. The substrate has an oxide film on its surface in some cases, depending on the embodiment. Further, the lower electrode layer is formed in orientation to a prescribed direction, and is formed in orientation to a prescribed direction over the lower electrode layer in some cases. Further, depending on the embodiment, the piezoelectric thin film element sometimes includes the upper electrode layer formed on the piezoelectric thin film. In this case, the piezoelectric thin film not including the upper electrode layer is sometimes called a substrate with piezoelectric thin film. Moreover, the lower electrode layer not including the piezoelectric thin film is sometimes called a substrate with lower electrode.

[Selection of the Substrate]

As the substrate, Si substrate, MgO substrate, ZnO substrate, $SrTiO_3$ substrate, $SrRuO_3$ substrate, a glass substrate, a quartz glass ($SiO_2$) substrate, GaAs substrate, GaN substrate, a sapphire substrate, Ge substrate, and a stainless substrate, etc, can be given. Particularly, an inexpensive industrially proved Si substrate is desirable. Further, the oxide film may be formed on the surface of the Si substrate, etc.

As the oxide film formed on the surface of the Si substrate, etc, a thermal oxide film formed by thermal oxidation, for example, the Si oxide film formed by CVD (Chemical Vapor Deposition) method, etc, can be given. Note that the lower electrode layer such as Pt electrode may be formed directly on the oxide substrate such as quartz glass ($SiO_2$), MgO, $SrTiO_3$, $SrRuO_3$ substrates, without forming the oxide film.

By selecting the material of the substrate, the internal stress of the piezoelectric thin film formed on the upper part of the substrate can be controlled.

[Thickness and Curvature Radius of the Substrate]

The internal stress of the piezoelectric thin film can be controlled by not selecting the material of the substrate, but selecting the thickness of the substrate or the curvature radius of the substrate. When the thickness of the substrate is large, the curvature radius (warpage amount) becomes large, and when the thickness is small, the curvature radius becomes small.

When the thickness of the substrate is 0.3 mm, the curvature radius of the substrate becomes 0.8 m which is the smallest, and therefore in order to make the internal stress of the piezoelectric thin film controllable, the thickness of the substrate is preferably set to 0.3 mm and the curvature radius is set to 0.8 m or more (example 2).

Further, preferably the variation rate of the curvature radius of the warpage shape of the substrate that increases/decreases depending on the variation rate of the thickness of the substrate, is preferably set to be twice or more of the variation rate of the thickness of the substrate.

When Young' modulus E, poisson's ratio ν, and thickness t of the piezoelectric thin film formed on the upper part are constant, the variation rate of the internal stress σ, substrate thickness h, and curvature radius R can be expressed in the form of differentiation as follows. The curvature radius R at this time is set as an absolute value.

$$\Delta\sigma/\sigma = 2\Delta h/h - \Delta R/R$$

When satisfying $\Delta R/R \geq 2\Delta h/h$, $2\Delta h/h - \Delta R/R \leq 0$ is satisfied, and therefore $$\Delta\sigma/\sigma \leq 0$$

is satisfied.

Figure 12:
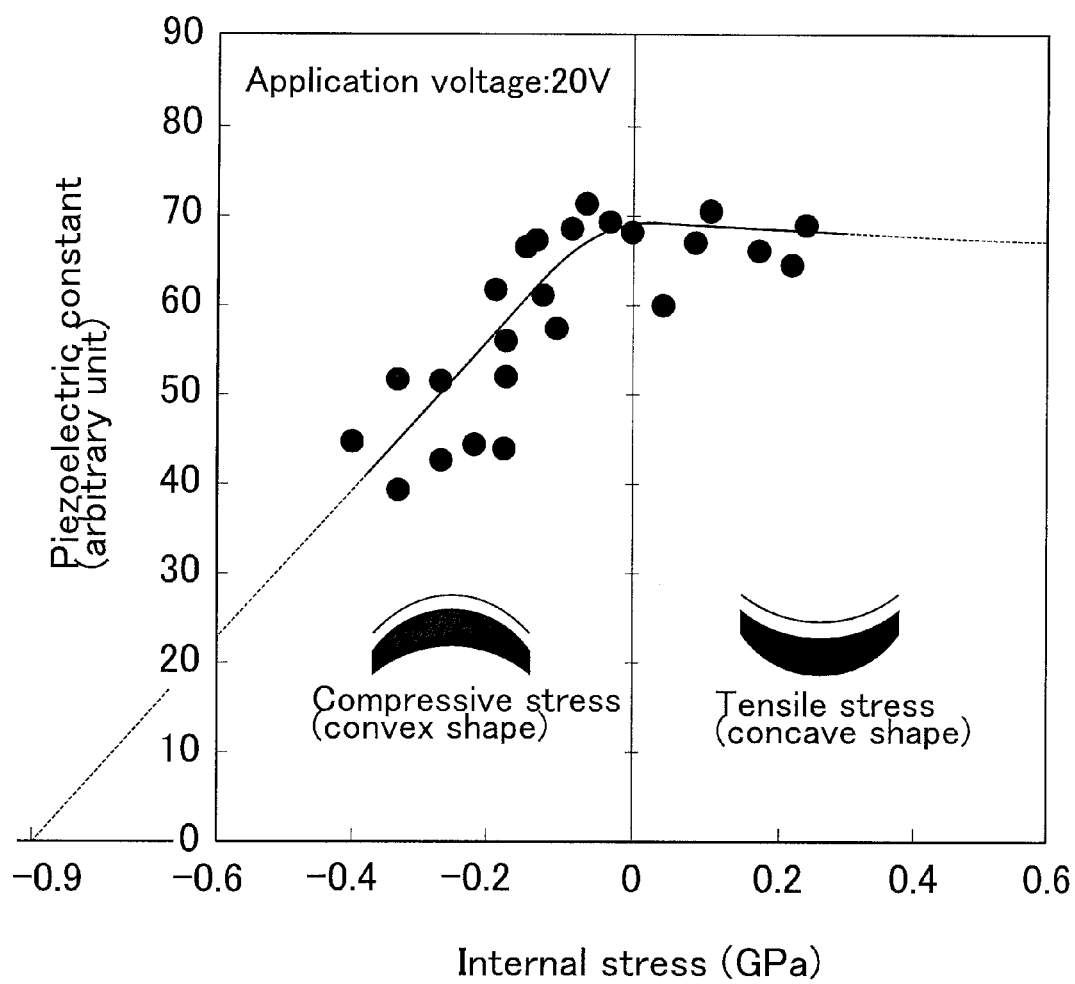
FIG. 12 is a correlation view between the internal stress and the piezoelectric constant when the application voltage is set to 20V in the piezoelectric thin film element according to an embodiment of the present invention.
Figure 13:
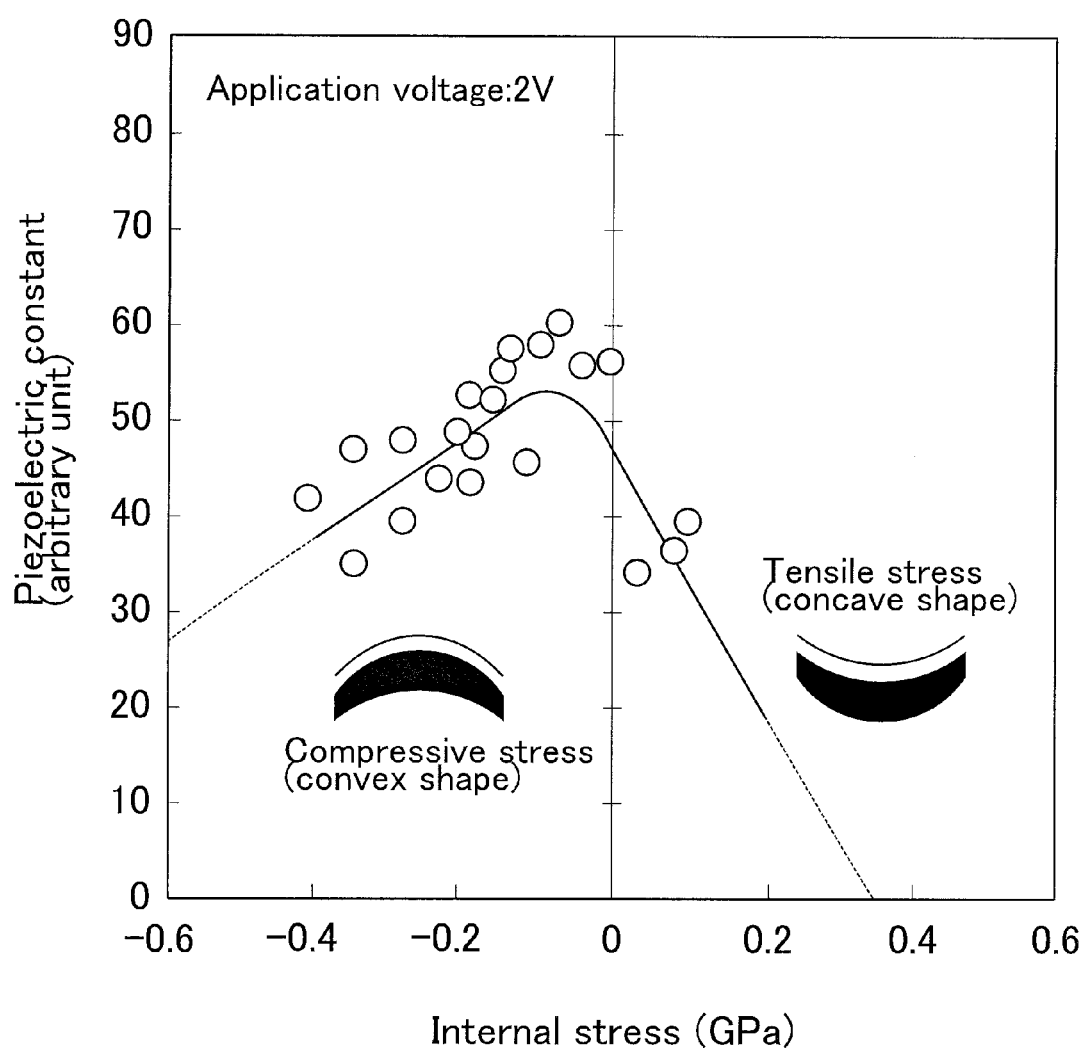
FIG. 13 is a correlation view between the internal stress and the piezoelectric constant when the application voltage is set to 2V in the piezoelectric thin film element according to an embodiment of the present invention.

As shown in the aforementioned formula, by setting the variation rate of the curvature radius ($\Delta R/R$) larger than twice ($2\Delta h/h$) of the variation rate of the substrate thickness, variation of the internal stress ($\Delta\sigma/\sigma$) can be controlled in a negative direction. Accordingly, by setting the variation rate of the curvature radius of the warpage shape of the substrate to be twice or more of the variation rate of the thickness of the substrate, the internal stress of the piezoelectric thin film formed on the upper part of the substrate can further suitably be controlled. Namely, the absolute value of the internal stress of the piezoelectric thin film with large internal stress can be made small. As a result, the piezoelectric characteristics can be improved by reduction of the internal stress of the KNN thin film (FIG. 12 and FIG. 13 of example 6).

[Lower Electrode Layer, Upper Electrode Layer, Adhesive Layer, and Base Layer]

The absolute value of the internal stress of the lower electrode layer, the upper electrode layer, or both electrode layers is preferably set to 1.6 GPa or less.

Further, when the adhesive layer is disposed between the lower electrode layer and the substrate, and the base layer is disposed between the lower electrode layer and the piezoelectric thin film, the absolute value of the internal stress of the disposed adhesive layer or the base layer or the both layers is preferably 1.6 GPa or less.

Thus, the curvature radius of the electrode, the adhesive layer, and the base layer, etc, is defined to fall within the same range as the range of the curvature radius of the piezoelectric thin film (1.6 GPa or less), so that the curvature radius requested in the piezoelectric thin film satisfies the requested curvature radius, even if being regulated from the electrode, the adhesive layer, and the base layer, etc, side. Further, the internal stress of the piezoelectric thin film that can be controlled by the substrate is 1.5 GPa or less at maximum (example 2), and therefore when the internal stress of the electrode, the adhesive layer, and the base layer is set to at least 1.6 GPa or less, the piezoelectric thin film element satisfying the requested performance can be obtained.

Further, preferably the lower electrode layer is a layer of not only Pt but also an alloy mainly composed of Pt, or may be a thin film having a lamination structure including a layer mainly composed of Pt. Further, the lower electrode layer is an electrode layer including Ru, Ir, Sn, and In or an oxide of them or an electrode layer of a lamination structure including a layer of a compound between the aforementioned elements and elements contained in the piezoelectric thin film.

The internal stress of the piezoelectric thin film formed on the upper part of the lower electrode can be controlled by using a Pt electrode or a Pt alloy, or others as the lower electrode of the piezoelectric thin film element, or by using Ru, Ir, or an oxide of them and Pt, and a compound between the aforementioned elements and elements contained in the piezoelectric thin film.

Further, preferably the Pt lower electrode layer is formed in orientation to (111) plane. By forming the lower electrode layer in orientation to (111) plane, the internal stress of the piezoelectric thin film formed on the upper part of the lower electrode can be controlled. By forming the Pt lower electrode layer by Pt thin film highly oriented to (111) plane, the Pt lower electrode layer functions as the base layer (orientation control layer) for controlling the orientation of the piezoelectric thin film.

Further, the lower electrode layer is preferably formed by sputtering. By using the sputtering method, a surface shape of the lower electrode formed at a higher temperature than the room temperature is formed into a concave shape, being in a state of the tensile stress, with the curvature radius being large, and the internal stress can be made small. Meanwhile, the surface shape of the lower electrode formed at the room temperature is formed into the convex shape, being in a state of the compressive stress, with the curvature radius being small, and the internal stress can not be small. Accordingly, the internal stress of the piezoelectric thin film formed on the upper part of the lower electrode can be controlled, by forming the lower electrode layer in an orientation manner, or by forming the lower electrode layer at a higher temperature than the room temperature by using the sputtering method.

Further, the adhesive layer for increasing adhesion to the substrate such as Ti layer may be formed between the substrate and Pt, or between the substrate and the electrode layer made of an alloy mainly composed of Pt. The internal stress of the piezoelectric thin film can be controlled by forming the adhesive layer. Accordingly, the internal stress of the piezoelectric thin film formed on the upper part of the lower electrode can be controlled by forming the lower electrode layer at a higher temperature than the room temperature by using the sputtering method. Further, the lower electrode layer may be formed, so that surface roughness of the lower electrode is set in such a manner that arithmetic average roughness Ra is 0.86 nm or less and square average roughness Rms is 1.1 nm or less, by controlling the film thickness of the lower electrode, or controlling the sputtering power and film forming temperature during film formation. Thus, variation of the piezoelectric constants can be suppressed and also the piezoelectric thin film device having excellent flatness of the piezoelectric thin film and the upper electrode surface formed on the piezoelectric thin film can be obtained.

Further, the curvature radius of the piezoelectric thin film is preferably set to 0.8 m or more. Alternatively, the curvature radius of the lower electrode layer or the upper electrode layer or both electrode layers is preferably 0.8 m or more. Alternatively, the adhesive layer or the base layer or both layers are disposed, and the curvature radius of the disposed adhesive layer or the base layer or the both layers is preferably set to 0.8 m or more. In order to set the internal stress of the piezoelectric thin film to the aforementioned 1.6 GPa or less, the curvature radius of this range needs to be satisfied in terms of the correlation between the curvature radius and the internal stress (formula (1) of example 1).

As described above, drop of an applied effective voltage due to increase of a leak current accompanying internal distortion, cracks of inside of the piezoelectric thin film and the electrode, and film peel-off in the interfacial surface between the piezoelectric thin film and the electrode, can be prevented by suitably selecting lower/upper electrode layers, the adhesive layer, or the base layer, and controlling the internal stress of the piezoelectric thin film to 1.6 GPa or less, or controlling the warpage shape of the piezoelectric thin film to 0.8 m or more. Then, the piezoelectric thin film element and the piezoelectric thin film device can be stably provided.

[Piezoelectric Thin Film]

The piezoelectric thin film is preferably formed as the thin film with perovskite oxide as a main phase, which is expressed by $(Na_xK_yLi_z)NbO_3$ ($0 \leq x \leq 1$, $0 \leq y \leq 1$, $0 \leq z \leq 0.2$, $x+y+z=1$). The piezoelectric thin film may be doped with a specific element. For example, potassium sodium niobate and lithium potassium sodium niobate may be doped with a prescribed amount of Ta or V. The piezoelectric thin film is formed by using the sputtering method such as a RF sputtering method.

In order to obtain an arbitrary stable piezoelectric constant, the absolute value of the internal stress of the piezoelectric thin film is preferably set to 1.6 GPa or less. Further, the curvature radius of the piezoelectric thin film is preferably set 0.8 m or more.

[Sputtering Input Electric Power]

The internal stress of the piezoelectric thin film is controlled by sputtering input electric power.

When the input electric power is small, the warpage shape of the element is the concave shape (tensile stress), and when the input electric power is large, the warpage shape of the element is the convex shape (compressive stress).

For example, in a case of the Si substrate, the warpage shape is set in a tensile stress state when the input electric power is low, and its internal stress takes a plus value, and when the input electric power is raised, the internal stress becomes zero in the vicinity of a certain value, and when the input electric power is further increased, its internal stress takes a minus value. Namely, zero crossing of the internal stress occurs according to the sputtering input electric power.

Therefore, by varying the sputtering input electric power during formation of the piezoelectric thin film, the internal stress of the piezoelectric thin film can be controlled and the absolute value of the internal stress can be controlled from 1.6 GPa.

Further, preferably a part of the piezoelectric thin film includes any one of the crystal layer of $ABO_3$ having the perovskite structure, the amorphous layer of $ABO_3$, or the mixed layer in which the crystal and amorphousness of $ABO_3$ are mixed. However, A is one kind or more elements selected from Li, Na, K, La, Sr, Nd, Ba, Bi, and B is one kind or more elements selected from Zr, Ti, Mn, Mg, Nb, Sn, Sb, Ta, In, and O is oxygen. Pb can be included as the piezoelectric material of the aforementioned site A. However, the piezoelectric thin film not including Pb is requested from an aspect of the environment.

Further, preferably the piezoelectric thin film is preferentially oriented to (001) in the vertical direction to the substrate.

[Heat Treatment Temperature after Film Formation]

The internal stress of the piezoelectric thin film can be controlled by varying the heat treatment temperature for heat treatment executed after forming the piezoelectric thin film.

By increasing the heat treatment temperature, the KNN piezoelectric thin film can be changed to be in a tensile stress state, namely from the convex shape to the concave shape. That is, the internal stress of the KNN piezoelectric thin film can be controlled to be a desired value, by varying the heat treatment temperature.

[Upper Electrode Layer]

The piezoelectric thin film element with low internal stress (distortion) can be manufactured by forming the upper electrode layer on the upper part of the piezoelectric thin film on the substrate with piezoelectric thin film according to the aforementioned embodiment.

Preferably the upper electrode layer is the electrode layer made of Pt or an alloy mainly composed of Pt, or the electrode layer of a lamination structure including the electrode layer mainly composed of Pt.

Alternatively, preferably the upper electrode layer is an electrode layer including Ru, Ir, Sn, and In or an oxide of them or an electrode layer of a lamination structure including a layer of a compound between the aforementioned elements and elements contained in the piezoelectric thin film.

Thus, when the upper electrode is formed by sputtering, using the same material as that of the lower electrode, the upper electrode layer can be formed in the same method as the lower electrode layer. Therefore the manufacturing step is preferably simplified. Note that unlike the lower electrode, the upper electrode needs not to have the piezoelectric thin film formed thereon, and therefore the upper electrode layer may be formed by vapor deposition by using aluminium (Al) metal, etc.

[Piezoelectric Thin Film Device]

Figure 14:
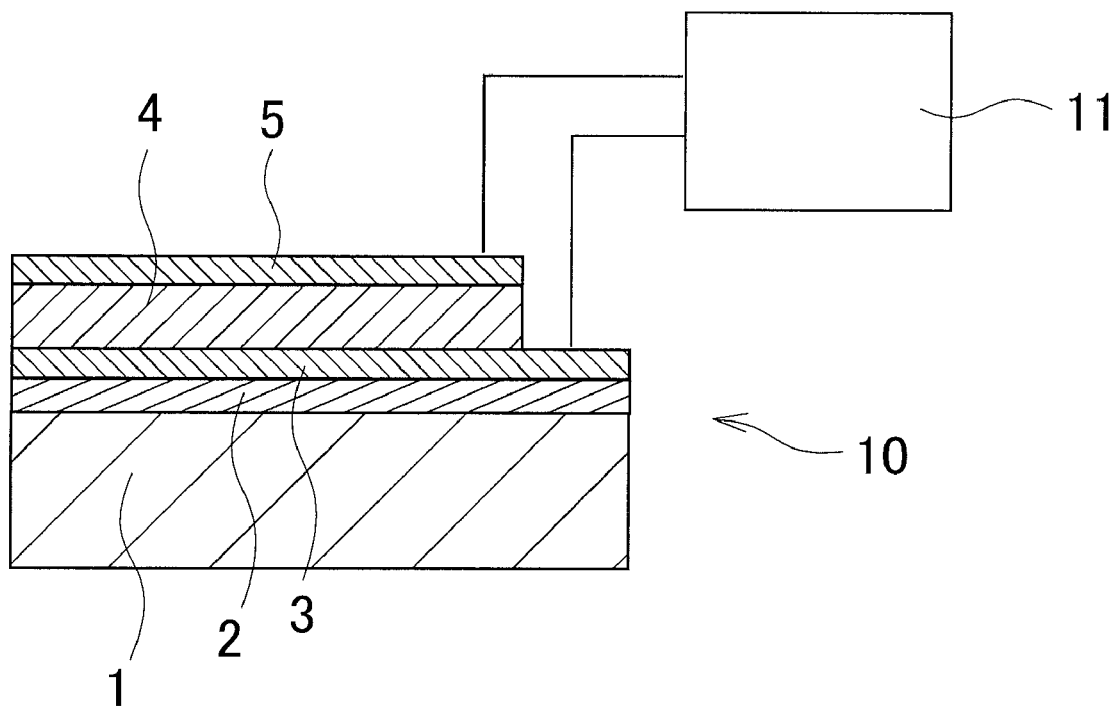
FIG. 14 is a schematic block diagram of a piezoelectric thin film device according to an embodiment of the present invention.

Here, the piezoelectric thin film device is obtained by forming the piezoelectric thin film element as a device. As shown in FIG. 14, the piezoelectric thin film device can be manufactured as each kind of actuator and sensor, by molding a piezoelectric thin film element 10 into a prescribed shape, which is manufactured by providing an adhesive layer 2, a lower electrode layer 3, a piezoelectric thin film 4, and an upper electrode layer 5 on a substrate 1, and connecting a voltage application part or a voltage detection part 11 between the lower electrode layer 3 and the upper electrode layer 5. Further, a filter device using a surface elastic wave can also be manufactured.

Particularly, a high performance micro device can be provided at a low cost, by realizing improvement and stabilization of the piezoelectric characteristics of the piezoelectric thin film element and the piezoelectric thin film device, by reducing the internal stress of the piezoelectric thin film. Further, depending on the device, the internal stress is controlled by increasing and decreasing the thickness of the piezoelectric thin film, etc, from the viewpoint of control of element intensity, etc, and also the substrate having a high elastic constant such as Young' modulus is selected, and the internal stress is optimized, thus making it possible to provide a diversified high performance micro device.

[Manufacturing Method of the Piezoelectric Thin Film Element]

The piezoelectric thin film element of this embodiment is manufactured by forming the lower electrode layer on the substrate, further forming the piezoelectric thin film thereon, and forming the upper electrode layer thereon. The piezoelectric thin film is a LKNN piezoelectric thin film, and is formed by the sputtering method. The internal stress of this piezoelectric thin film is controlled, so that its absolute value is set to 1.6 GPa or less, depending on the manufacturing condition of the element.

Figure 4:
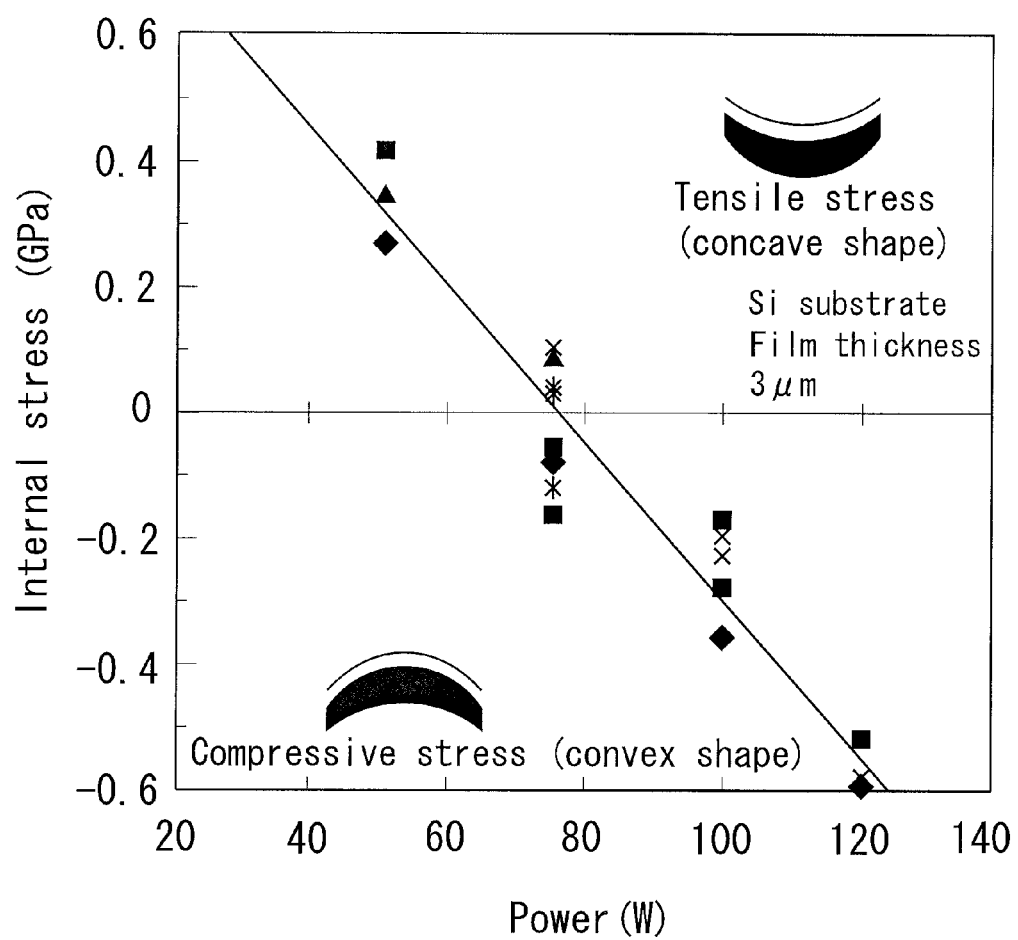
FIG. 4 is a correlation view between an internal stress obtained by the optical lever method of the KNN piezoelectric thin film and a sputtering input electric power according to an embodiment of the present invention.

In order to obtain the internal stress of the piezoelectric thin film, the sputtering input electric power during formation of the piezoelectric thin film is controlled within a range of 40 W to 120 W, and preferably sputtering input electric power density is controlled within a range of 0.010 W/mm$^2$ to 0.040 W/mm$^2$ (FIG. 4 in example 1).

Figure 7:
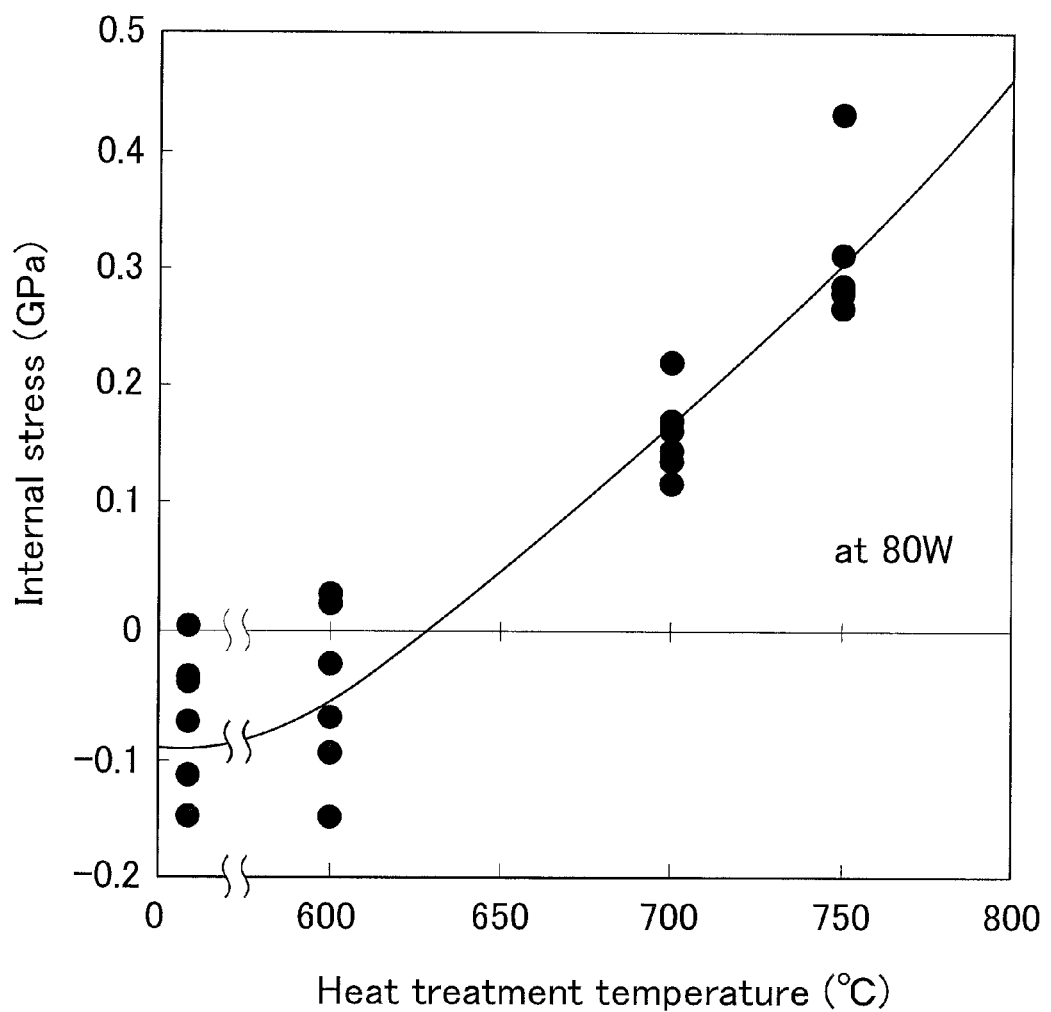
FIG. 7 is a correlation view between the internal stress of the KNN piezoelectric thin film and a heat treatment temperature for the heat treatment executed after film formation, according to an embodiment of the present invention.

Further, in order to obtain the internal stress of the piezoelectric thin film, the temperature for the heat treatment executed after formation of the piezoelectric thin film is controlled within a range of 800° C. or less or preferably within a range of 600° C. to 750° C. (FIG. 7 in example 3).

Figure 10:
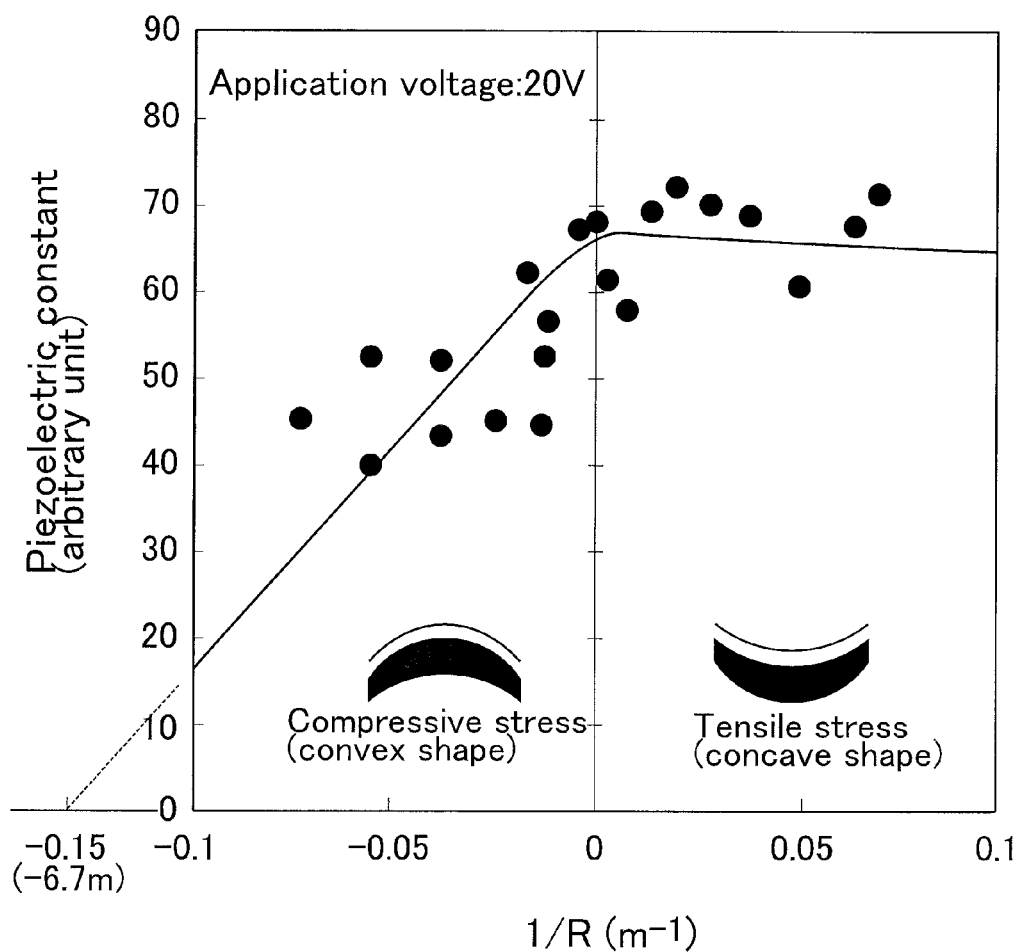
FIG. 10 is a correlation view between a warpage amount (curvature) and a piezoelectric constant of a substrate when an application voltage is set to 20V in the piezoelectric thin film element according to an embodiment of the present invention.

Further, the absolute value of the curvature of the piezoelectric thin film is controlled to be 0.15 m$^{-1}$ or less, or preferably within a range of 0.07 m$^{-1}$ or less (FIG. 10 of example 6).

Further, the absolute value of the internal stress of the piezoelectric thin film is controlled within a range of 0.9 GPa or less, or preferably within a range of 0.45 GPa or less (FIG. 12 of example 6).

[Effects of the Embodiments]

According to one or more embodiments of the present invention, the following effects can be given.

In an embodiment of the present invention, the piezoelectric thin film, electrode, substrate, adhesive layer, and base layer, being constituent materials, are appropriately managed and selected, and the manufacturing conditions of the materials are optimized, and the internal stress of the element is precisely controlled by accurately measuring the warpage shapes, etc, of them. According to an embodiment of the present invention, excellent piezoelectric characteristics can be realized by controlling the internal stress. Further, the piezoelectric thin film element with high performance and high reliability can be realized, and the piezoelectric thin film element and the piezoelectric thin film device with high manufacturing yield and high quality can be obtained.

The piezoelectric thin film element according to an embodiment of the present invention is the piezoelectric thin film element including the piezoelectric thin film not using lead. Accordingly, by mounting the piezoelectric thin film element according to an embodiment of the present invention, a small-sized system device such as small-sized motor, sensor, and actuator with high performance, capable of reducing environmental load, for example MEMS (Micro Electro Mechanical System), etc, can be realized. Further, by using the lower electrode layer as the base layer, with the upper electrode formed on the piezoelectric thin film as a prescribed pattern, a filter device having excellent filter characteristics can be realized.

Further, according to this embodiment, the piezoelectric thin film of LKNN and the piezoelectric thin film element and the piezoelectric thin film device excellent in flatness of an electrode surface can be obtained.

In an aspect of the present invention, in the piezoelectric thin film element composed of a lamination structure of the substrate, lower electrode, piezoelectric thin film, and upper electrode, by controlling the curvature radius of the warpage shape of the piezoelectric thin film to 0.8 m or more, or controlling the internal stress to 1.6 GPa or less, increase of the leak current accompanying internal distortion and drop of an application effective voltage due to internal crack or peel-off of the film in the interface between the piezoelectric thin film and the electrode, can be prevented. Further, the piezoelectric thin film of the present invention is formed by the sputtering method. At this time, sputtering operation gas is contained in the formed piezoelectric thin film. The internal stress of the piezoelectric thin film can also be controlled by controlling the sputtering operation gas used for film formation and the content of the sputtering operation gas in the piezoelectric thin film.

Further, by using the Pr electrode or Pt alloy or others as the lower electrode of the piezoelectric thin film element, or using Ru, Ir or the oxide of them and a compound between the aforementioned elements and the element contained in the piezoelectric thin film, the internal stress of the piezoelectric thin film formed on the upper part can be controlled. Further, regarding the substrate as well, by using MgO substrate, SrTiO$_2$ substrate, glass substrate, quartz glass substrate, GaAs substrate, sapphire substrate, Ge substrate, and stainless substrate, etc, other than Si, the internal stress of the piezoelectric thin film formed thereon can be controlled. Thus, the piezoelectric characteristics can be further improved.

EXAMPLE 1

Next, examples of the present invention will be described.

EXAMPLE 1

In example 1, the internal stress is controlled by varying the input electric power.

FIG. 1 shows a cross-sectional view showing an outline of the substrate with piezoelectric thin film. In this example, the piezoelectric thin film element (substrate with piezoelectric thin film) was manufactured by forming an adhesive layer 2 on a Si substrate 1 having an oxide film, and forming thereon a lower electrode 3 and a piezoelectric thin film 4 made of potassium sodium niobate (described as KNN hereafter) having a perovskite structure. At that time, a state of the internal stress of the piezoelectric thin film is varied depending on the manufacturing condition.

FIG. 1A shows a cross-sectional view of the substrate with piezoelectric thin film, wherein the warpage is formed into a convex shape toward the front surface side. Here, the front surface side is a surface opposite side to the substrate. The convex shape shows a state that stress is added in mutually pushing direction in the surface of the piezoelectric thin film, and shows a sol-called a compressive stress state. Meanwhile, FIG. 1B shows a cross-sectional view of the substrate with piezoelectric thin film formed into the convex shape toward the front surface side. This shows a state that the stress is added in mutually attracting direction in the surface of the piezoelectric thin film, and shows a tensile stress state.

[Manufacturing Method of the Substrate with Piezoelectric Thin Film]

First, as shown in FIG. 1, a thermal oxide film was formed on the surface of the Si substrate 1, and a lower electrode layer 3 was formed thereon. The lower electrode layer 3 is composed of a Ti film formed as an adhesive layer 2 and a Pt thin film formed on the Ti film as an electrode layer. The Pt thin film functions as a base layer. However, the Pt thin film is called a Pt lower electrode layer here.

A 4-inch-sized Si substrate with thermal oxide film was used as the Si substrate of an example of the present invention. Also, the Si substrate with a thickness of 0.3 mm, in orientation to (100) plane was used. The thickness of the oxide film was set to 150 nm. A Ti adhesive layer with a thickness of 1 nm to 20 nm is manufactured on the Si substrate by sputtering. When the Pt lower electrode was formed, a Pt metal target was used as a sputtering target, and 100% Ar gas was used as sputtering gas, and pressure was set to 2.5 Pa. A substrate temperature set to 300° C. during formation of the Pt thin film, and the PT thin film as a polycrystalline thin film was formed. As a comparative example, the Pt thin film was formed, with the substrate temperature set to a normal temperature. Note that when the Pt thin film was formed, sputtering input electric power was controlled between 65 W and 100 W. In this example, a Ti adhesive layer and the Pt thin film were formed, with the sputtering input electric power set to 75 W, until the film thickness was 2 nm and 200 nm respectively. Thus, the Si substrate with two kinds of Pt electrodes was manufactured.

Next, the KNN piezoelectric thin film was formed on the Pt lower electrode layer of the Si substrate with such two kinds of Pt electrodes, as the piezoelectric thin film 4. The KNN piezoelectric thin film was also formed by sputtering. When the KNN piezoelectric thin film was formed, the substrate was heated, so that the substrate temperature was controlled in a range of 600° C. to 900° C. In this example, the substrate temperature was controlled to be 650° C. Then sputtering was performed by plasma using a mixed gas of $Ar^+O_2$. The mixture ratio was set to 9:1. A sintered body target expressed by $(Na_xK_yLi_z)NbO_3$ (wherein x=0.5, y=0.5, z=0) was used as the sputtering target. The film formation was performed until the film thickness was 3 μm. The film formation was performed, with the sputtering input electric power set to 120 W. Further, the KNN piezoelectric thin film was also formed by varying the input electric power down to 50 W. Regarding the KNN piezoelectric thin film thus formed, a crystal structure was examined by using an X-ray diffraction device.

Figure 2:
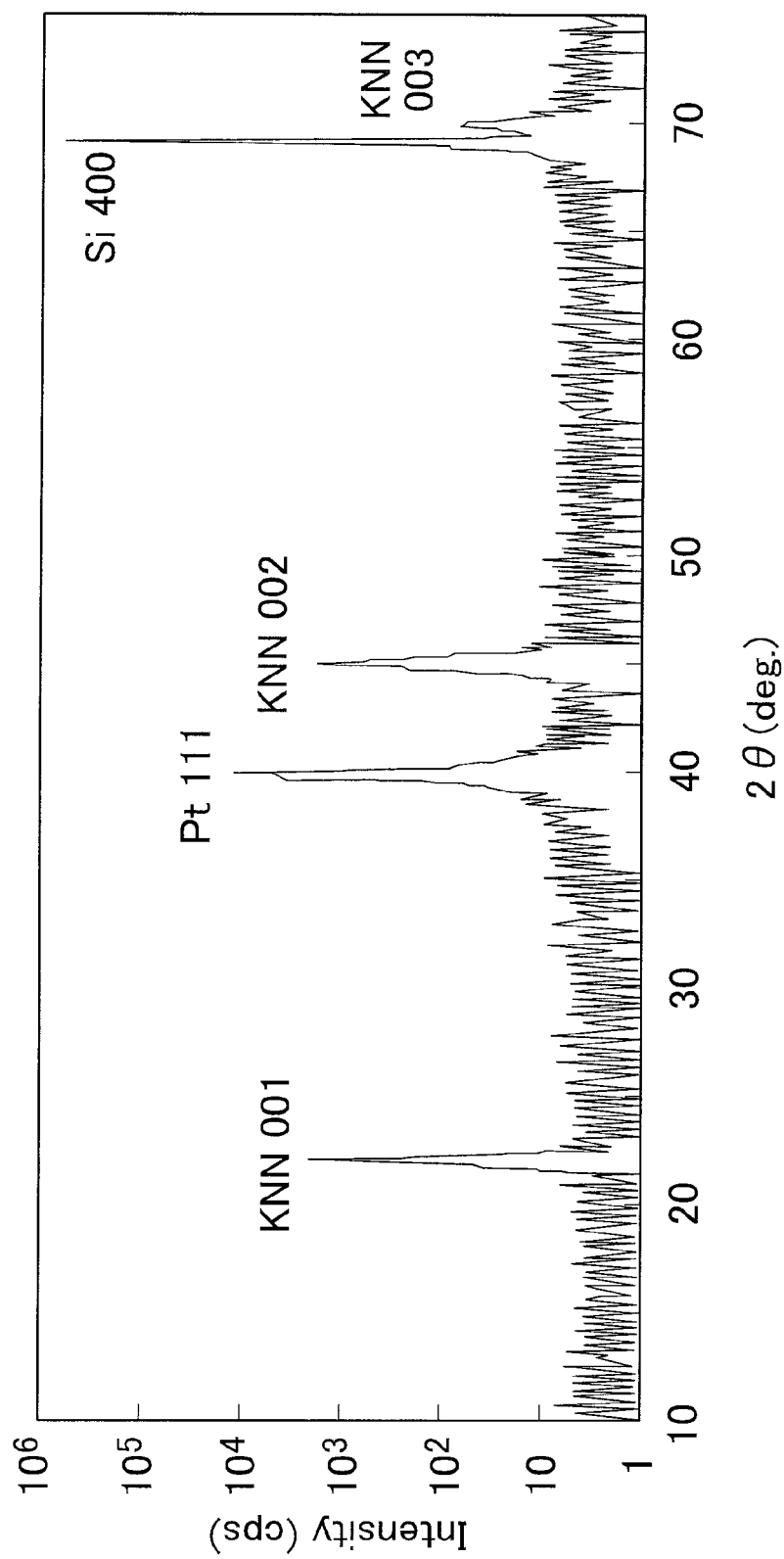
FIG. 2 is a view showing an X-ray diffraction pattern of the piezoelectric thin film element according to an embodiment of the present invention.

As a result, in the Pt thin film of the example 1 formed by heating the substrate at 300° C., as shown in an X-ray diffraction pattern (2θ/θ scan measurement) of FIG. 2, it was found that the thin film was formed in such a manner as being oriented to Pt(111) plane vertically to the surface of the substrate. Further, as shown in FIG. 2, the KNN piezoelectric thin film formed on the Pt thin film oriented to Pt(111), was strongly oriented to KNN(001).

Meanwhile, as a result of examining the Pt film formed at a normal temperature by X-ray diffraction measurement, it was confirmed that there was no diffraction from a specific crystal plane, and the Pt film was in an amorphous state. Further, it was found that there was no orientation surface on the KNN piezoelectric thin film formed on the Pt thin film which was formed at a normal temperature and this KNN piezoelectric thin film was in a state of a random polycrystalline film. Accordingly, preferably the Pt thin film (Pt lower electrode layer) makes the KNN film oriented, specifically oriented to Pt(111).

In this example, regarding the KNN piezoelectric thin film with the internal stress controlled by varying the film forming condition, etc, the warpage shape of the surface was analyzed by an optical lever method. In this measurement, a thin film range of −10 mm to +10 mm was scanned at a pitch of 1 mm, and amount of displacement was measured at each point.

Figure 3:
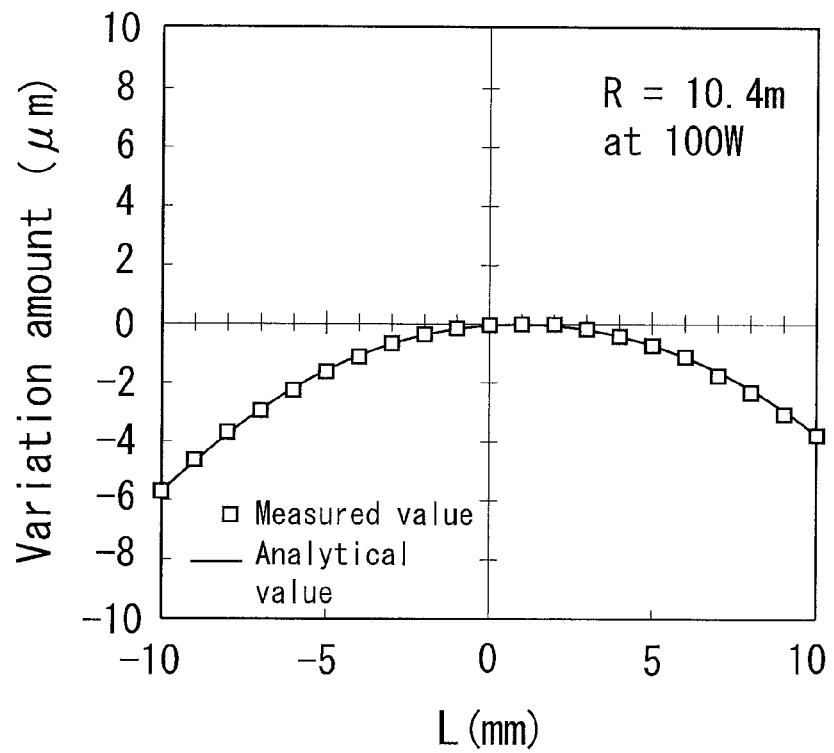
Figure 3:
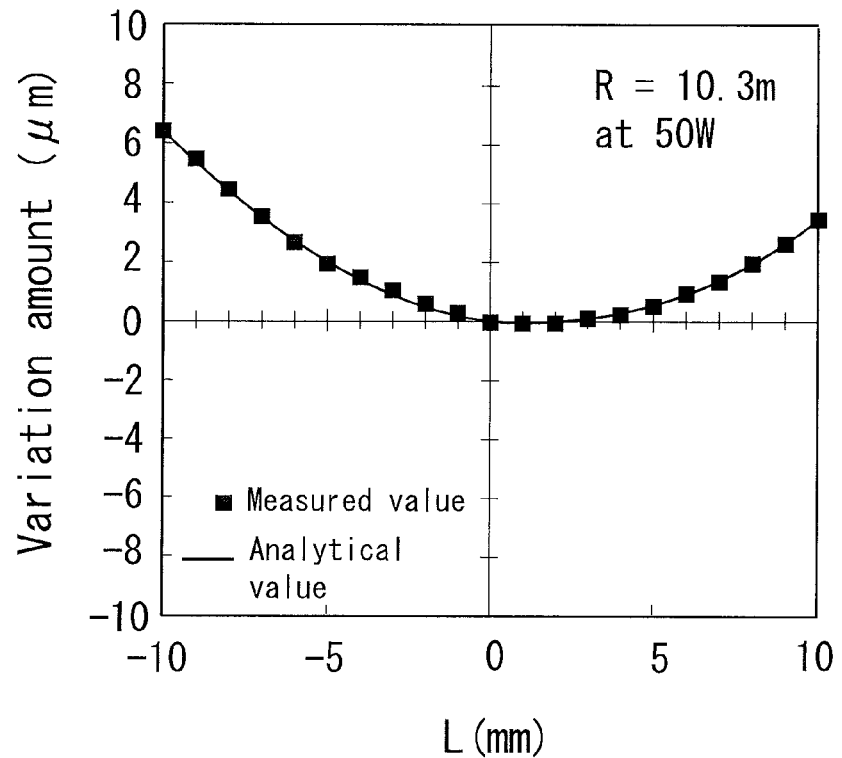

FIG. 3 shows a measurement result of the warpage shape of the surface of the piezoelectric thin film of the example 1. Regarding the obtained measured data, curvature radius was obtained by performing fitting analysis (solid line shown in FIG. 3) by the method of least squares.

As a result, when the film formation was performed with the input electric power set to 100 W, as shown in FIG. 3A, the warpage shape was formed into a convex shape shown in FIG. 1A, and the internal stress was in the compressive stress state. At this time, curvature radius R, being an analytical value of the warpage amount, was 104 m.

Meanwhile, when the film formation was performed with the input electric power set to 100 W, the warpage shape was the convex shape as shown in FIG. 1B, and the internal stress was in a tensile stress state. The curvature radius R of the warpage shape was 10.3 m. If the curvature radius R thus obtained is used, internal stress σ in the surface of the KNN piezoelectric thin film can be obtained. In this example, calculation was performed based on a definition formula (1) shown below.

$$\sigma = Eh^2/(1-v) \cdot 6Rt \qquad (1)$$

Wherein, E indicates the Young' modulus, v indicates the Poisson ratio, h indicates the thickness, t indicates the film thickness of the thin film, and R indicates the warpage amount (curvature radius) of the substrate, and t, h, and R are in a relation of t<<h<<R. See the following documents (1) and (2) given below, for details.

(1) Residual stress and distortion, written by Hajime Sudo, (Uchida Rokakuho, 1988)
(2) "Thin film", written by Sadashi Yoshida, Library 3 of Applied Physical Engineering, (BAIFUKAN CO., LTD 1990)

The internal stress of the KNN piezoelectric thin film was obtained based on the aforementioned formula (1). The substrate used in this example was a (100)Si wafer. As mechanical physical values of the substrate, Young' modulus E was 130.8 GPa, Poisson ratio v was 0.28, and h was 0.6 mm. Further, thickness t of the KNN piezoelectric thin film was 3 μm. Based on these values, as a result of calculating the internal stress of the KNN piezoelectric thin film manufactured by the aforementioned condition, it was found that the internal stress was 0.351 GPa when the film formation was performed, with input electric power set to 100 W, and the internal stress was 0.353 GPa when the film formation was performed, with input electric power set to 50 W.

Next, in order to examine a variation manner of the internal stress of the KNN piezoelectric thin film with respect to the sputtering input electric power, the internal stress of the KNN piezoelectric thin film was analyzed, with the input electric power varied from 50 W to 120 W. In the size of the sputtering target used at this time, diameter was 50 mm, and the substrate used for film formation was a (100) Si substrate.

FIG. 4 shows a result thereof. In this figure, values of the internal stress are taken on the vertical axis, and regarding positive and negative signs, the tensile stress is shown in the positive, and the compressive stress state is shown in the negative.

As shown in FIG. 4, the internal stress was in a tensile stress state when the input electric power was 50 W, and the internal stress at this time was 0.3 to 0.4 GPa. It was found that as the input electric power became larger, the tensile stress of the KNN piezoelectric thin film became smaller. Then, the internal stress of the KNN piezoelectric thin film became almost 0 in the vicinity of 75 W. When the input electric power was further increased, it was found that the warpage shape of the substrate was changed from the concave shape to the convex shape and the tensile stress was changed to the compressive stress state. When the input electric power was increased to 120 W, it was found that the value of the compressive stress was increased to 0.6 GPa. As a result of further examination, it was found that the KNN piezoelectric thin film having the internal stress of +0.4 GPa to −0.6 GPa can be obtained by controlling the sputtering input electric power to be in a range of 40 W to 120 W, preferably by controlling the sputtering input electric power density to be in a range of 0.010 W/mm² to 0.040 W/mm² during formation of the piezoelectric thin film. Here, the sputtering input electric power density means a value obtained by dividing the input electric power applied to a target, by an area of a sputtering face of the target.

As described above, it is found that the internal stress of the KNN piezoelectric thin film can be controlled by varying the sputtering input electric power. In this example, the KNN piezoelectric thin film with low internal stress can be manufactured by controlling the sputtering input electric power in the vicinity of 75 W.

EXAMPLE 2

In example 2, the internal stress is controlled by selecting a substrate material. Further, the oriented KNN piezoelectric thin film on the Pt electrode according to the example 1, was manufactured by using the substrate other than the Si substrate. Since the Young' modulus, the Poisson ratio, and the thermal expansion coefficient, being elastic constants of each substrate, are different, the internal stress added to the KNN piezoelectric thin film formed thereon is expected to be varied, and the internal stress is considered to be controllable. Actually, as a result of examination with the substrate material changed to various substances, it was found that the internal stress state of the KNN piezoelectric thin film was different in each substrate.

Figure 5:
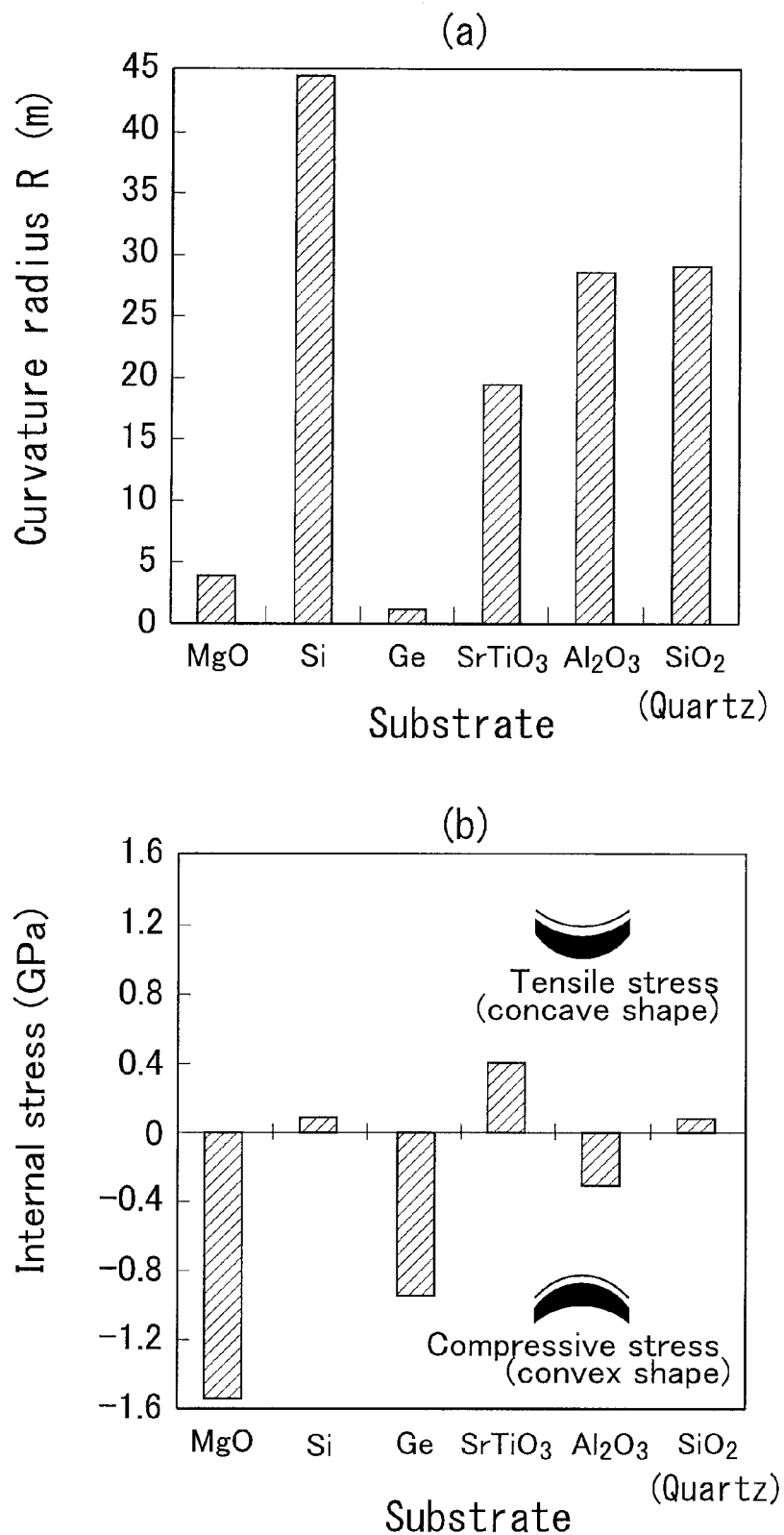

Substrates prepared in this example 2 are MgO, Si, Ge, SrTiO₃, Al₂O₃ and SiO₂. The sputtering input electric power during formation of the KNN piezoelectric thin film was set to 100 W. FIG. 5A shows the warpage shape of the KNN piezoelectric thin film when the film was formed on each substrate. At this time, the KNN piezoelectric thin film formed on the Ge substrate with a thickness of 0.3 mm had a smallest curvature radius, and it was 0.8 m. Meanwhile, it was found that the KNN piezoelectric thin film formed on the Si substrate having a thickness of 0.6 mm had a maximum curvature radius, and the warpage amount was small.

Based on such a result, the result of calculating the internal stress is shown in FIG. 5B. In this example, the internal stress of the KNN piezoelectric thin film is varied in either state of the compressive stress state or the tensile stress state. As shown in FIG. 5B, as a result of analyzing the internal stress of the substrate with piezoelectric thin film, it was found that the internal stress of the KNN piezoelectric thin film was in a compression state and it was about 1.5 GPa, when particularly the MgO substrate was used. Further, in a case of the Ge substrate, the internal stress was in a compressive stress state and it was 0.94 GPa. In a case of the Al₂O₃ substrate, the compressive stress was 0.31 GPa.

Meanwhile, when Si and SiO₂ were used, the internal stress of the KNN piezoelectric thin film was in the tensile stress state. However, it was found that the value was small and could be almost 0. A described above, the KNN piezoelectric thin film having a desired internal stress could be manufactured by selecting a suitable substrate. Further, in a glass substrate and a SUS substrate as well, similar effects can be obtained from the viewpoint that the internal stress of the KNN piezoelectric thin film is controllable.

As described above, it was found that by selecting the substrate, the substrate with piezoelectric thin film and the piezoelectric thin film element having a desired internal stress could be obtained. Then, by controlling the internal stress to be 1.6 GPa or less, a small-sized system device such as a small-sized motor, a sensor, and an actuator, with an environmental load reduced, or a filter device can be suitably selected and used.

EXAMPLE 3

In example 3, the internal stress is controlled by varying the heat treatment temperature.

Figure 6:
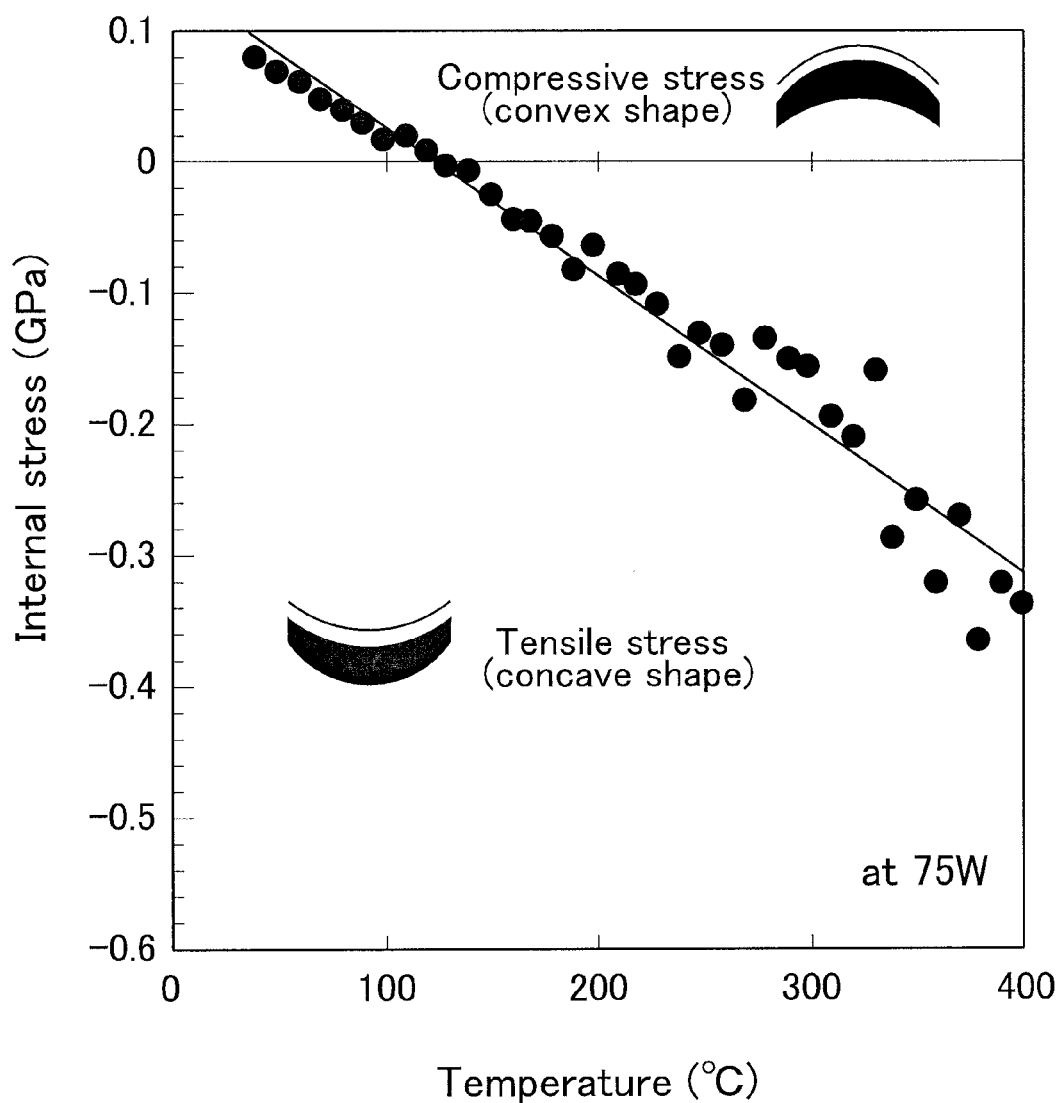
FIG. 6 is a temperature characteristic view of the internal stress of the KNN piezoelectric thin film according to an embodiment of the present invention.

In order to examine the variation of the internal stress with respect to the temperature of the KNN piezoelectric thin film, the warpage shape, namely the temperature variation of the internal stress of the KNN piezoelectric thin film having a cross-sectional structure described in the example 1, was examined. FIG. 6 shows the result of the temperature characteristics. Note that the compressive stress is taken on the positive vertical axis, and the tensile stress state is taken on the negative axis. In this example 3, the element with KNN film formed at 75 W was evaluated, and the heat treatment was applied thereto in the atmosphere. From this figure, it was found that the KNN piezoelectric thin film in the compressive stress state at a room temperature by heat treatment, was changed to the tensile stress state, and the tensile stress was increased with an increase of the temperature. This shows that the thermal expansion coefficient of the KNN piezoelectric thin film is larger than that of the Si substrate. Based on this result, difference of the thermal expansion coefficients between the piezoelectric thin film and the Si substrate can be quantitatively estimated. Generally, the internal stress by heat can be expressed by the following formula (2).

$$\sigma = E_f(\alpha_f - \alpha_s)\Delta T \qquad (2)$$

Wherein, $E_f$ indicates the Young' modulus, $\alpha_f$ indicates the thermal expansion coefficient of the thin film, $\alpha_s$ indicates the thermal expansion coefficient of the substrate, and $\Delta T$ indicates a temperature variation value. In this example, when the temperature variation of the internal stress shown in FIG. 6 was analyzed by least squares method fitting using a linear function, it was found that inclination of the straight line was $1.14 \times 10^{-3}$ GPa·K⁻¹, corresponding to $\sigma/\Delta T$. When $E_f$ of the KNN piezoelectric thin film is set to 110.7 GPa, and $\alpha_s$ of the Si substrate is set to $3.2 \times 10^{-6}$ K⁻¹, the thermal expansion coefficient $\alpha_f$ of the KNN piezoelectric thin film is $1.35 \times 10^{-5}$ K⁻¹. As a result, it is found that the thermal expansion coefficient of the KNN piezoelectric thin film is about four times that of the substrate. When the substrate is suitably selected in consideration of a combination of the substrate and the piezoelectric thin film based on the aforementioned index, there is a possibility that the heat treatment temperature is useful as a control parameter of the internal stress of the KNN piezoelectric thin film.

Therefore, in order to examine whether the internal stress of the KNN piezoelectric thin film can be controlled by the heat treatment after film formation, the internal stress of the KNN piezoelectric thin film was analyzed after film formation, when the heat treatment was applied from a state of no heat treatment to a state of being heated up to 750° C. Specifically, after film formation, the temperature was decreased once to a room temperature and thereafter the heat treatment was applied. The internal stress was measured after the temperature of the KNN piezoelectric thin film after heat treatment was decreased again to the room temperature. The heat treatment at this time was performed in the atmosphere, but the heat treatment may be performed in O₂ atmosphere or N₂ atmosphere or inactive gas such as Ar, or a mixed gas containing at least one of the aforementioned gases. Note that the substrate used in film formation is (100)Si.

FIG. 7 shows the result, wherein the tensile stress is taken on the positive vertical axis, and the compressive stress is taken on the negative axis.

As shown in FIG. 7, it was found that when the film formation was performed with the sputtering input electric power set to 80 W, the KNN piezoelectric thin film was in the compressive stress state and the internal stress was about 0 to 0.15 GPa, in a case that the heat treatment was not performed. Also, it was found that when the heat treatment was applied to the KNN piezoelectric thin film for 1 hour, the warpage shape of the substrate was changed.

As shown in FIG. 7, when the heat treatment was performed at 600° C., it was found that tendency of changing from the compressive stress state to the tensile stress state was observed, and the internal stress was close to 0.

When the heat treatment was performed at 700° C. higher than the aforementioned temperature, it was found that the concave shape of the substrate became remarkable, and the internal stress was set in the tensile stress state of about 0.2 GPa. When the heat treatment was performed at further high 750° C., the tensile stress became larger to be 0.4 GPa. By increasing the heat treatment temperature from 600° C., the tensile stress state of the KNN piezoelectric thin film can be changed from the convex shape to the concave shape. Namely, by varying the heat treatment temperature, the internal stress of the KNN piezoelectric thin film can be controlled to a desired value. Particularly, it was found that in this example, when the KNN piezoelectric thin film with low internal stress was manufactured, temperature control in the vicinity of 600° C. was preferable.

Accordingly, in order to obtain the KNN piezoelectric thin film having the internal stress of 0.4 GPa or less, the temperature of the heat treatment executed after film formation of the piezoelectric thin film is controlled to 800° C. or less, and in order to obtain the KNN piezoelectric thin film having the internal stress of −0.1 GPa~+0.3 GPa, the temperature of the heat treatment executed after film formation is controlled within a range of 600° C. to 750° C.

EXAMPLE 4

In example 4, the internal stress of the thin film is controlled by providing the base layer.

Figure 8:
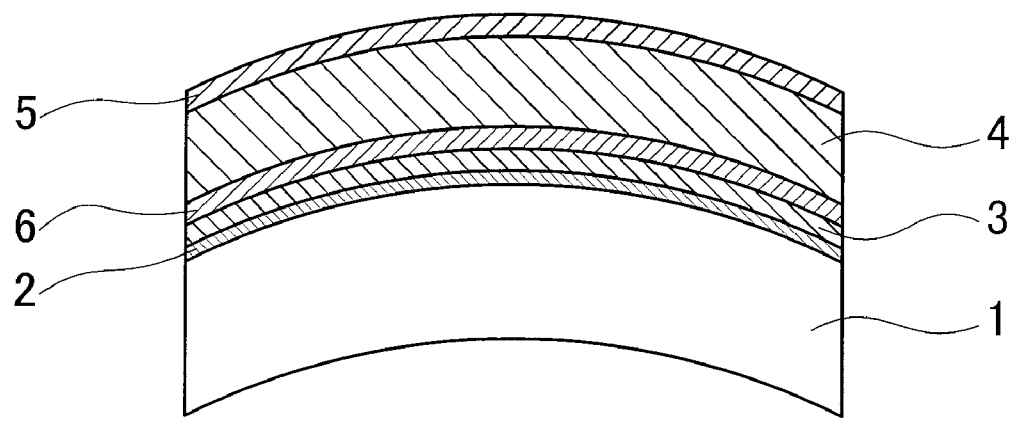
Figure 8:
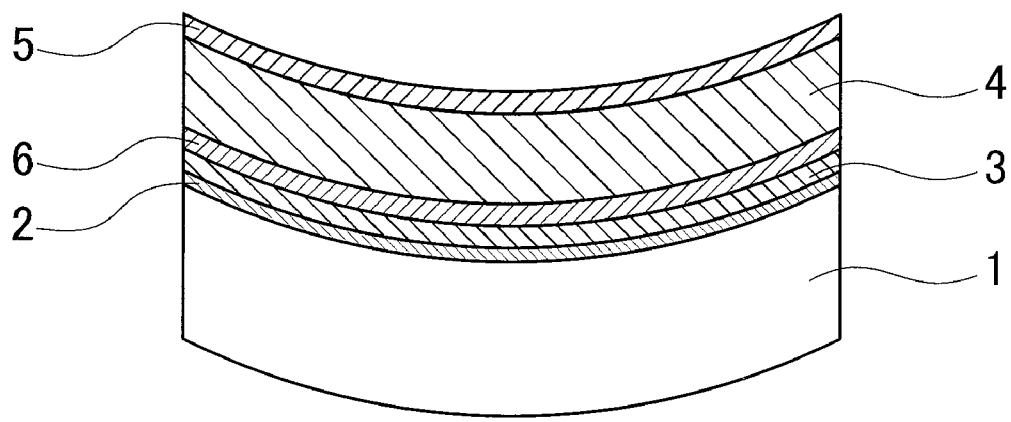

FIG. 8 shows a cross-sectional view of the piezoelectric thin film element of the example 4. In this example 4, the piezoelectric thin film element was formed, including the lower electrode layer 3, the base layer 6, being an orientation control layer for improving the orientation of the KNN, the piezoelectric thin film 4 of KNN, and the upper electrode layer 5, formed on the upper part of the adhesive layer 2 which was formed on the Si substrate 1 having an oxide film.

In the same way as the example 1, the lower electrode layer 2 was formed on the Si substrate 1 through the adhesive layer 2, then the lower electrode layer 2 was crystallized and was oriented to Pt(111), and a LaNiO$_3$ (Lanthan Nickel Oxide; LNO) film was formed on a surface-flattened Pt electrode as the base layer 6. The LNO film was easily oriented to (001) plane on Pt(111). The LNO film was also formed by using the sputtering method. The mixed gas of Ar$^+$O2 (mixture ratio 9:1) was used as the sputtering gas. The film formation was performed until the film thickness was 200 nm, with the sputtering input electric power set to 75 W. When X-ray diffraction measurement of the LNO film was performed, it was found that single orientation to LNO(001) occurred. The piezoelectric thin film of the KNN film was formed on the base layer 6 of the LNO film. Forming conditions were same as the conditions of the example 1.

As a result of evaluating an orientation state of the KNN piezoelectric thin film thus formed by using the X-ray diffraction device, it was found that the KNN piezoelectric thin film was more strongly oriented to KNN(001) than the KNN piezoelectric thin film formed in the example 1. In a case of this example, as shown in FIG. 8A, it was confirmed that the warpage shape of the substrate was formed into the convex shape by increasing the sputtering input electric power to be larger than 100 W during formation of the KNN piezoelectric thin film.

Further, it was confirmed that the warpage of the substrate was formed into the concave shape as shown in FIG. 8B, by performing the heat treatment at 600° C. or more in the atmosphere. Regarding the aforementioned element, as a result of analyzing the internal stress by the optical lever method, it was confirmed that when the sputtering input electric power was increased, the internal stress was set in the compressive state, and the stress was increased up to about −1 GPa.

Meanwhile, the tensile stress was increased by increasing the heat treatment temperature, and was increased up to about 1 GPa. As described above, in the same way as the example 1 or 3, it was found that the magnitude of the internal stress could be controlled and the KNN piezoelectric thin film showing desired piezoelectric characteristics could be manufactured.

Next, the upper electrode layer 5 was formed on the piezoelectric thin film 4 of the manufactured KNN film. Al was selected as the material of the upper electrode layer 5, and the upper electrode layer 5 was formed by using vacuum deposition. It was found that the surface of the upper electrode layer 5 formed on the upper part of the flat piezoelectric thin film 4 was also formed into the warpage shape approximately the same as the warpage shape of the piezoelectric thin film 4.

EXAMPLE 5

In example 5, the internal stress of the thin film is controlled by changing the base layer.

Figure 9:
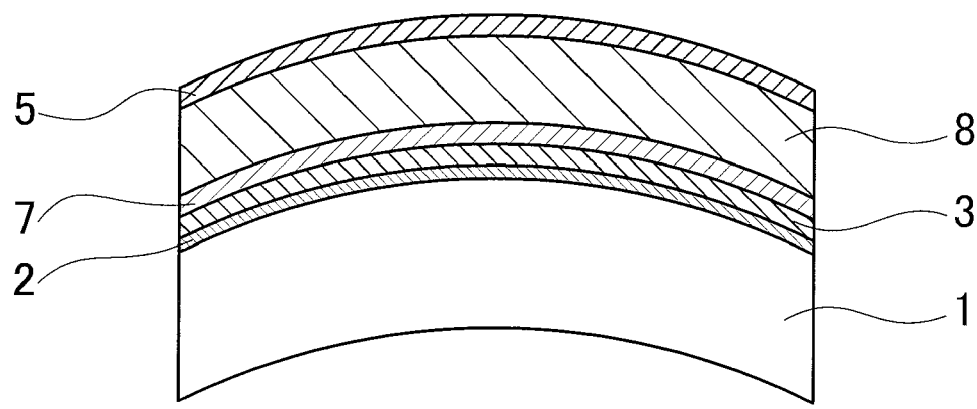
Figure 9:
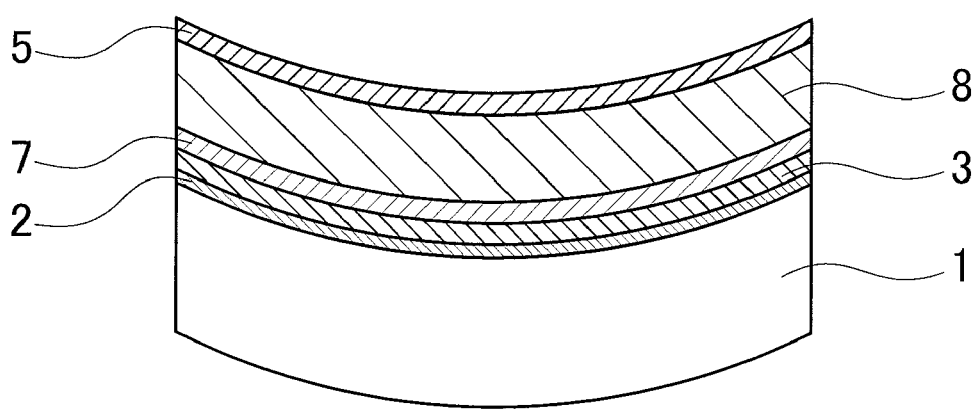

FIG. 9 shows a cross-sectional view of the piezoelectric thin film element of the example 5. In this example 5, the piezoelectric thin film element was manufactured, including the lower electrode layer 3, the base layer 7 made of sodium niobate, the piezoelectric thin film 8 of LKNN, and the upper electrode layer 5, formed on the upper part of the adhesive layer 2 which was formed on the Si substrate having the oxide film.

Sodium niobate (NaNbO$_3$) was used in the base layer 7. Further, in this example 5, LKNN(Na$_x$K$_y$Li$_z$)NbO$_3$, described as LKNN hereafter) obtained by doping KNN with lithium was used in the piezoelectric thin film 8. LKNN is composed of five elements of lithium (Li), potassium (K), sodium (Na), niobium (Nb), and oxygen. However, if the sodium niobate (NabO$_3$) not containing lithium and potassium is used as the base layer, there is no possibility that an inside of a chamber for performing sputtering is contaminated with a substance other than constituent elements of the piezoelectric thin film 8, and therefore the piezoelectric thin film can be formed by using the same chamber as the chamber in which the base layer is formed, and the base layer and the piezoelectric thin film can be sequentially formed.

First, the same substrate with Pt electrode as that of the example 4 was prepared, and the base layer 7 made of sodium niobate was formed thereon. The sputtering method was used for forming the base layer 7. The Ar+O$_2$ mixed gas (mixture ratio was 8.5:1.5) was used as the sputtering gas, and the film formation was performed until the film thickness was 200 nm, with RF electric power set to 100 W. When the sodium niobate film thus formed was evaluated by the X-ray diffraction device, it was found that the film was preferentially oriented to (001) plane. Next, the piezoelectric thin film 8 of the LKNN film was formed on the base layer 7 of the sodium niobate film. The LKNN piezoelectric thin film was formed by using the sputtering method. The substrate was heated at 600° C. during film formation, and sputtering was performed by plasma using the mixed gas of Ar+$O_2$ (mixture ratio was 9:1). The sintered body target made of $(Na_xK_yLi_z)NbO_3$, wherein x=0.48, y=0.48, z=0.04, was used as the target. The film formation was performed until the film thickness was 3 μm, with the sputtering input electric power set to 100 W. When the crystal structure was analyzed by using the X-ray diffraction device, it was found that the LKNN piezoelectric thin film was oriented to two planes of (110) and (001).

Regarding the element of this example, the internal stress was evaluated by using the optical lever method. As a result, in the same way as the example 4, when the sputtering input electric power of LKNN was increased, as shown in FIG. 9A, the internal stress was in the compressive stress state in the form of the convex shape, and was increased up to about −0.8 GPa.

Meanwhile, the internal stress was in the tensile stress state in the form of the concave shape as shown in FIG. 9B, by increasing the heat treatment temperature performed after film formation, and was increased up to about 0.8 GPa. Accordingly, it was found that the LKNN film showing desired piezoelectric characteristics could be manufactured by controlling the magnitude of the internal stress by the sputtering input electric power and the heat treatment temperature.

Further several materials of the base layer were examined. As a result, there is an effect that the magnitude of the internal stress can be controlled in $LaAlO_3$, $SrTiO_3$, $SrRuO_3$, $La_{0.6}Sr_{0.4}FeO_3$, $La_{0.6}Sr_{0.4}CoO_3$, $KNbO_3$, in the same way as $NaNbO_3$ and $LaNiO_3$. Moreover, similar effect could be obtained by laminating them ($KNbO_3$ was formed on $LaNiO_3$) or dissolving them ($La(Ni,Al)O_3$, etc.) to form a solid solution.

As described above, in the same way as the example 4, the LKNN film with low internal stress can be manufactured by accurately controlling the sputtering input electric power and the heat treatment temperature, then a flat and highly oriented piezoelectric thin film can be manufactured, and the piezoelectric thin film with high performance can be realized.

Next, the upper electrode layer 5 was formed on the piezoelectric thin film 8 of the manufactured KNN film. Al was selected as the material of the upper electrode layer 5, and the upper electrode layer 5 was formed by using the vacuum deposition method. It was found that the surface of the upper electrode layer 5 formed on the upper part of the flat piezoelectric thin film 8 was also formed into the same warpage shape as the warpage shape of the piezoelectric thin film 8.

EXAMPLE 6

In example 6, the piezoelectric constant is controlled by changing the internal stress of the piezoelectric thin film.

The example 6 shows the warpage shape and suitable values (range) of the internal stress of the substrate of the piezoelectric thin film, with respect to effective piezoelectric constants, in the KNN piezoelectric thin film element on the Si substrate shown in the example 1.

The piezoelectric constants measured here are the piezoelectric constants obtained by applying voltage of 20V to the KNN piezoelectric thin film having a film thickness of 3 μm.

FIG. 10 shows a correlation view between the warpage shape (curvature) of the substrate and the piezoelectric constants, as one of the examples.

Inverse numbers of the curvature radius R, namely curvatures (1/R) are taken on the horizontal axis of FIG. 10. The unit is $m^{-1}$. The piezoelectric constants are taken on the vertical axis. As a specific example of the vertical axis, $d_{33}$, being a variation amount of vertical extension/contraction (in a thickness direction) vertical to an electrode surface, or $d_{31}$, being a variation amount of extension/contraction in a direction along the electrode surface, can be given.

The unit of the piezoelectric constants here is an arbitrary unit. The reason is as follows. In order to obtain the piezoelectric constants, numerical values such as Young' modulus and poisson's ratio of the piezoelectric thin film are required. However, it is not easy to obtain the numerical values of the Young' modulus and the Poisson's ratio of the piezoelectric thin film. Particularly, unlike a bulk body, the thin film receives influence (restraint) from the substrate used during film formation, and therefore it is difficult in principle to obtain the absolute value (true value) of the Young' modulus and the Poisson's ratio of the thin film itself. Therefore, the piezoelectric constants were calculated by using the Young' modulus and the Poisson's ratio of the KNN thin film which has been known heretofore. Accordingly, the obtained piezoelectric constants were estimated values and therefore set to be relatively arbitrary unit so as to have objectivity. However, although the values of the Young' modulus and the poisson's ratio of the KNN thin film used for calculating the piezoelectric constants are estimated values, and they are reliable values to some degree. Therefore, it can be said that about 70 [arbitrary unit] of the piezoelectric constant means that piezoelectric constant d31 is 70[−pm/V]. The same thing can be said for FIG. 11 to FIG. 13 as will be described later.

Figure 11:
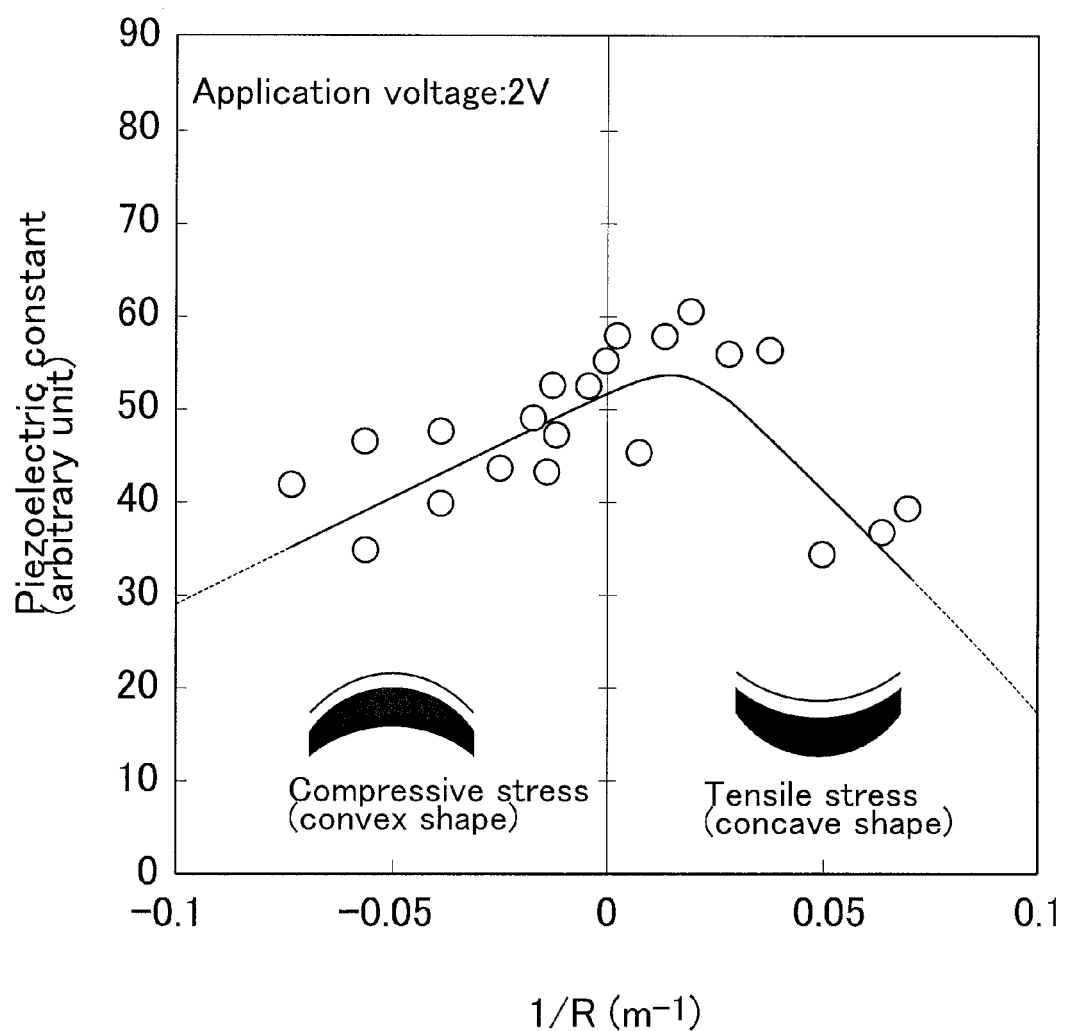
FIG. 11 is a correlation view between the warpage amount (curvature) of the substrate and the piezoelectric constant when the application voltage is set to 2V in the piezoelectric thin film element according to an embodiment of the present invention.

Further, when the horizontal axis is the negative, the compressive stress is shown, and when the axis is the positive, the tensile stress is shown. As shown in this figure, it is found that in a range of the compressive stress state, the piezoelectric constants become larger, as the curvature is close to 0 (curvature radius becomes large). Reversely, the piezoelectric constants become small, as the curvature becomes larger (curvature radius becomes smaller). Particularly, when the curvature is about $-0.15$ $m^{-1}$ (curvature radius is about $-6.7$ m), the piezoelectric constant becomes approximately 0. Meanwhile, it is found that in the tensile stress state, when the curvature is in the vicinity of 0 (curvature radius is large), the piezoelectric constant is apt to be slightly larger, but even if the curvature becomes large, the piezoelectric constants are not decreased. This means that the piezoelectric constants are sensitive to the variation of the compressive stress and when the warpage of the substrate is formed into the convex shape, the magnitude of the piezoelectric constants is influenced by this warpage amount (curvature). Note that as shown in FIG. 11, even in a case of the piezoelectric constant with an application voltage of 2V, which is not more than 20V, almost similar result can be obtained in the correlation between the piezoelectric constant and the internal stress. Accordingly, in the compressive stress state, by controlling the curvature radius to be not less than 6.7 m, a desired piezoelectric constant can be secured.

Accordingly, in order to obtain the KNN piezoelectric thin film element having a desired piezoelectric constant, the absolute value of the curvature of the piezoelectric thin film is preferably controlled to be in a range of 0.15 $m^{-1}$ or less, and in order to obtain the KNN piezoelectric thin film element having the piezoelectric constant higher than the desired piezoelectric constant, the absolute value of the curvature of the piezoelectric thin film is preferably controlled in a range of 0.07 m$^{-1}$ or less.

Next, FIG. 12 shows the correlation view between the internal stress and the piezoelectric constant of the KNN piezoelectric thin film. Table 1 shows a measured value of the internal stress and the piezoelectric constant of each sample. The value of the internal stress of the KNN piezoelectric thin film is taken on the horizontal axis of FIG. 12. The unit is GPa. Further, when the horizontal axis is the negative, the compressive stress is shown, and when the axis is the positive, the tensile stress state is shown. Further, in this example, when the Pt lower electrode is formed, it is found that in the compressive stress state, the piezoelectric constant becomes large as the internal stress of the KNN piezoelectric thin film is close to 0. Reversely, the piezoelectric constant becomes small as the internal stress becomes larger. Particularly, when the internal stress is about 0.9 GPa, the piezoelectric constant becomes approximately 0. As shown in FIG. 13 and table 2, almost similar result is obtained in the correlation between the piezoelectric constant in a case of an application voltage of 20V or less, and the internal stress. Accordingly, in the compressive stress state, by controlling the internal stress to be 0.9 or less, a desired piezoelectric constant can be secured. Namely, by controlling the internal stress of the KNN piezoelectric thin film to be an optimal value based on the obtained correlation in this example, the piezoelectric thin film element having required performance for each kind of device can be manufactured.

TABLE 1

| Sample | Internal stress (GPa) | Piezoelectric constant (arbitrary unit) |
| --- | --- | --- |
| Sample 1 | −0.127 | 61 |
| Sample 2 | −0.182 | 52 |
| Sample 3 | −0.226 | 44 |
| Sample 4 | −0.185 | 44 |
| Sample 5 | −0.275 | 42 |
| Sample 6 | −0.338 | 39 |
| Sample 7 | −0.152 | 66 |
| Sample 8 | −0.137 | 67 |
| Sample 9 | −0.062 | 71 |
| Sample 10 | −0.086 | 68 |
| Sample 11 | −0.180 | 56 |
| Sample 12 | −0.032 | 69 |
| Sample 13 | 0.003 | 68 |
| Sample 14 | −0.197 | 61 |
| Sample 15 | −0.106 | 57 |
| Sample 16 | 0.117 | 70 |
| Sample 17 | 0.096 | 67 |
| Sample 18 | 0.047 | 60 |
| Sample 19 | −0.275 | 51 |
| Sample 20 | −0.339 | 51 |
| Sample 21 | −0.403 | 44 |

TABLE 2

| Sample | Internal stress (GPa) | Piezoelectric constant (arbitrary unit) |
| --- | --- | --- |
| Sample 22 | −0.127 | 57 |
| Sample 23 | −0.182 | 52 |
| Sample 24 | −0.226 | 43 |
| Sample 25 | −0.185 | 42 |
| Sample 26 | −0.275 | 39 |
| Sample 27 | −0.338 | 34 |
| Sample 28 | −0.152 | 51 |
| Sample 29 | −0.137 | 54 |
| Sample 30 | −0.062 | 59 |
| Sample 31 | −0.086 | 57 |

TABLE 2-continued

| Sample | Internal stress (GPa) | Piezoelectric constant (arbitrary unit) |
| --- | --- | --- |
| Sample 32 | −0.180 | 46 |
| Sample 33 | −0.032 | 55 |
| Sample 34 | 0.003 | 55 |
| Sample 35 | −0.197 | 48 |
| Sample 36 | −0.106 | 45 |
| Sample 37 | 0.117 | 38 |
| Sample 38 | 0.096 | 35 |
| Sample 39 | 0.047 | 33 |
| Sample 40 | −0.275 | 47 |
| Sample 41 | −0.339 | 46 |
| Sample 42 | −0.403 | 41 |

Note that samples 1 to 42 shown in table 1 and table 2 were prepared based on the conditions described in the example 1. The sample having different internal stress was obtained by controlling the substrate temperature during film formation, the sputtering input electric power, and the heat treatment temperature after film formation. Specifically, the Si substrate with thermal oxide film was used as the substrate. The substrate having a size of 4 inches and thickness of 0.3 mm, and having (100) plane orientation, was used. Further, the thickness of the oxide film was set to 150 nm. Ti adhesive layer of 2 nm was formed on the Si substrate, and Pt thin film (lower electrode layer) of 200 nm was formed on the Ti adhesive layer. The Pt lower electrode was preferentially oriented to (111) plane. The Ti adhesive layer and the Pt thin film were formed, with the substrate temperature during film formation set to 300° C., using 100% Ar gas as the sputtering gas, with the pressure set to 2.5 Pa.

The thickness of the KNN film, being the piezoelectric thin film, was set to 3 μm. The KNN sintered body target was used as the sputtering target. The substrate temperature during film formation was controlled between 600° C. and 900° C., and power was controlled so that the input electric power density was within a range of 0.010 W/mm$^2$ to 0.040 W/mm$^2$. The mixed gas of Ar+O$_2$ (mixture ratio 9:1) was used as the sputtering operation gas, and the pressure was controlled between 0.4 Pa to 1.3 Pa. The heat treatment temperature after forming the KNN film was controlled in a range of 600° C. to 750° C. Further, distance between the target and the substrate (distance between TS) in this example was controlled between 100 mm and 150 mm.

Further, as shown in this example, by performing film formation by the sputtering method using Ar-containing gas as the operation gas, Ar is contained in the piezoelectric thin film. When Ar is contained in the piezoelectric thin film, Ar and elements constituting the piezoelectric thin film have different atomic radius, and therefore Ar invades between crystal lattice of the piezoelectric thin film, or replace the elements constituting the piezoelectric thin film, thus generating the internal stress in the piezoelectric thin film in some cases. In this case, by suitably controlling the input electric power, distance between TS, and the gas mixture ratio, Ar-containing amount in the piezoelectric thin film is set within a prescribed range, and the warpage amount of the piezoelectric thin film is controlled. In the piezoelectric thin film element in this example, the Ar-containing amount was set to 80 ppm or less in the mass ratio. Note that the Ar-containing amount of the KNN piezoelectric thin film containing Ar was evaluated by using a fluorescent X-ray analysis apparatus (System 3272 by Rigaku Corp.).

As shown in this example, in order to obtain the KNN piezoelectric thin film having a desired piezoelectric constant, the absolute value of the internal stress of the piezoelectric thin film is preferably controlled in a range of 0.9 GPa or less, and in order to obtain the KNN piezoelectric thin film element having the piezoelectric constant higher than the desired piezoelectric constant, the absolute value of the internal stress is preferably controlled in a range of 0.45 GPa or less.

According to this example, the piezoelectric thin film having excellent piezoelectric constant can be formed without using lead on the Si substrate. Thus, a piezoelectric device having high performance such as an actuator and a sensor can be realized, without using lead, being an environmental load substance. Further, in this example, an example of forming the Pt thin film, being the lower electrode layer, between the substrate and the piezoelectric thin film, is shown. However, the base layer (orientation control layer) for controlling the orientation of the KNN piezoelectric thin film may be directly formed on the substrate, and then the KNN piezoelectric thin film may be formed. In this case, the filter device utilizing the surface elastic wave can be fabricated by forming the upper electrode having a prescribed pattern on the KNN piezoelectric thin film.

What is claimed is:

1. A piezoelectric thin film element, comprising:
a substrate; and
a piezoelectric thin film formed on the substrate, with perovskite oxide expressed by $(Na_xK_yLi_z)NbO_3$ ($0 \leq x \leq 1$, $0 \leq y \leq 1$, $0 \leq z \leq 0.2$, $x+y+z=1$) as a main phase,
wherein an absolute value of an internal stress of the piezoelectric thin film is 1.6 GPa or less, and
a variation rate of a curvature radius of a warpage shape of the substrate that increases/decreases according to a variation rate of a thickness of the substrate, is twice or more of the variation rate of the thickness of the substrate.

2. The piezoelectric thin film element according to claim 1, wherein a base layer for controlling an orientation of the piezoelectric thin film, is formed between the substrate and the piezoelectric thin film.

3. The piezoelectric thin film element according to claim 2, wherein the base layer is a Pt thin film formed in orientation to (111) plane.

4. The piezoelectric thin film element according to claim 2, wherein a lower electrode layer is formed between the substrate and the base layer, and an adhesive layer is formed between the lower electrode layer and the substrate, and an absolute value of an internal stress of the adhesive layer or the base layer or both layers is 1.6 GPa or less.

5. The piezoelectric thin film element according to claim 1, wherein the curvature radius of the piezoelectric thin film is 0.8 m or more.

6. The piezoelectric thin film element according to claim 1, wherein an upper electrode layer is formed on the piezoelectric thin film, and a lower electrode layer is formed between the substrate and the piezoelectric thin film, and a curvature radius of the lower electrode layer or the upper electrode layer or both electrode layers is 0.8 m or more.

7. The piezoelectric thin film element according to claim 1, wherein the piezoelectric thin film is formed in an atmosphere of Ar gas or a mixed gas in which oxygen is mixed into the Ar gas by a sputtering method, and Ar is contained in the piezoelectric thin film.

8. The piezoelectric thin film element according to claim 1, wherein the substrate is a Si substrate with an oxide film.

9. A manufacturing method of manufacturing the piezoelectric thin film element according to claim 1, wherein an absolute value of an internal stress of the piezoelectric thin film is controlled in a range of 0.9 GPa or less.

10. A piezoelectric thin film device, comprising the piezoelectric thin film element according to claim 1 and a voltage application part or a voltage detection part.

11. A piezoelectric thin film element, comprising:
a substrate; and
a piezoelectric thin film formed on the substrate, with perovskite oxide expressed by $(Na_xK_yLi_z)NbO_3$ ($0 \leq x \leq 1$, $0 \leq y \leq 1$, $0 \leq z \leq 0.2$, $x+y+z=1$) as a main phase,
wherein an absolute value of an internal stress of the piezoelectric thin film is 1.6 GPa or less,
a base layer for controlling an orientation of the piezoelectric thin film, is formed between the substrate and the piezoelectric thin film,
a lower electrode layer is formed between the substrate and the base layer, and an adhesive layer is formed between the lower electrode layer and the substrate, and
an absolute value of an internal stress of the adhesive layer or the base layer or both layers is 1.6 GPa or less.

12. A piezoelectric thin film device, comprising the piezoelectric thin film element according to claim 11 and a voltage application part or a voltage detection part.

13. A piezoelectric thin film element, comprising:
a substrate;
a piezoelectric thin film formed on the substrate, with perovskite oxide as a main phase, wherein an absolute value of an internal stress of the piezoelectric thin film is 1.6 GPa or less; and
a variation rate of a curvature radius of a warpage shape of the substrate that increases/decreases according to a variation rate of a thickness of the substrate, is twice or more of the variation rate of the thickness of the substrate.

14. The piezoelectric thin film element according to claim 13, wherein the piezoelectric thin film contains Ar.

15. The piezoelectric thin film device, comprising the piezoelectric thin film element according to claim 13 and a voltage application part or a voltage detection part.

16. A piezoelectric thin element, comprising:
a substrate;
a piezoelectric thin film formed on the substrate, with perovskite oxide as a main phase, wherein an absolute value of an internal stress of the piezoelectric thin film is 1.6 GPa or less;
a base layer for controlling an orientation of the piezoelectric thin film, the base layer formed between the substrate and the piezoelectric thin film;
a lower electrode layer formed between the substrate and the base layer; and
an adhesive layer formed between the lower electrode layer and the substrate,
wherein an absolute value of an internal stress of the adhesive layer or the base layer or both layers is 1.6 GPa or less.

17. The piezoelectric thin film element according to claim 16, wherein the base layer is a Pt thin film formed in orientation to (111) plane.

18. The piezoelectric thin film element according to claim 16, wherein the curvature radius of the piezoelectric thin film is 0.8 m or more.

19. The piezoelectric thin film element according to claim 16, wherein an upper electrode layer is formed on the piezoelectric thin film, and a curvature radius of the lower electrode layer or the upper electrode layer or both electrode layers is 0.8 m or more.

20. The piezoelectric thin film element according to claim 16, wherein the piezoelectric thin film contains Ar.

21. The piezoelectric thin film element according to claim 16, wherein the substrate is a Si substrate with an oxide film.

22. A manufacturing method of manufacturing the piezoelectric thin film element according to claim 16, wherein an absolute value of an internal stress of the piezoelectric thin film is controlled in a range of 0.9 GPa or less.

23. A piezoelectric thin film device, comprising the piezoelectric thin film element according to claim 16 and a voltage application part or a voltage detection part.

* * * * *